United States Patent
Taniguchi et al.

(10) Patent No.: US 9,871,181 B2
(45) Date of Patent: Jan. 16, 2018

(54) PRODUCTION METHOD OF THERMOELECTRIC CONVERTER, PRODUCTION METHOD OF ELECTRONIC DEVICE EQUIPPED WITH THERMOELECTRIC CONVERTER, AND THERMOELECTRIC CONVERTER

(71) Applicant: DENSO CORPORATION, Kariya, Aichi-pref. (JP)

(72) Inventors: Toshihisa Taniguchi, Handa (JP); Yoshihiko Shiraishi, Nagoya (JP); Atusi Sakaida, Nagoya (JP); Keiji Okamoto, Kariya (JP); Eijirou Miyagawa, Tokai (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/465,035

(22) Filed: Mar. 21, 2017

(65) Prior Publication Data

US 2017/0213953 A1    Jul. 27, 2017

Related U.S. Application Data

(62) Division of application No. 14/404,705, filed as application No. PCT/JP2013/062460 on Apr. 26, 2013, now Pat. No. 9,680,079.

(30) Foreign Application Priority Data

May 30, 2012   (JP) ................................. 2012-122824
Jan. 24, 2013  (JP) ................................. 2013-011513

(51) Int. Cl.
*H01L 35/04*    (2006.01)
*H01L 35/32*    (2006.01)
(Continued)

(52) U.S. Cl.
CPC .............. *H01L 35/32* (2013.01); *H01L 35/10* (2013.01); *H01L 35/34* (2013.01)

(58) Field of Classification Search
CPC .......... H01L 35/04; H01L 35/32; H01L 35/34
See application file for complete search history.

(56) References Cited

U.S. PATENT DOCUMENTS 4,902,648 A    2/1990  Ohta et al.
5,103,286 A    4/1992  Ohta et al.
(Continued)

FOREIGN PATENT DOCUMENTS

JP    H01-179376 A    7/1989
JP    H08-153899 A    6/1996
(Continued)

OTHER PUBLICATIONS

Dec. 2, 2014 International Preliminary Report on Patentability issued in International Application No. PCT/JP2013/062460.
(Continued)

*Primary Examiner* — Golam Mowla
(74) *Attorney, Agent, or Firm* — Oliff PLC

(57) ABSTRACT

As the first conductive paste, a paste is used which is made by adding an organic solvent to powder of alloy in which a plurality of atoms keep a given crystal structure constant. As the second conductive paste, a paste is used which is made by adding an organic solvent to powder of metal different in kind from the alloy. In a step of making the stack body, cavities are formed in the stack body. In a uniting step, the cavities work to facilitate flow of thermoplastic resin to absorb pressure acting in a direction different from a direction in which pressure exerted on the first conductive paste to unite the stack body, thereby resulting in an increase in (Continued)

pressure for the uniting to solid-state sinter the first conductive paste to make the first layer-to-layer connecting member.

9 Claims, 12 Drawing Sheets

(51) Int. Cl.
*H01L 35/10* (2006.01)
*H01L 35/34* (2006.01)

(56) References Cited

U.S. PATENT DOCUMENTS

| | | |
|---|---|---|
| 6,127,619 A | 10/2000 | Xi et al. |
| 6,347,521 B1 | 2/2002 | Kadotani et al. |
| 2006/0289051 A1 | 12/2006 | Niimi et al. |
| 2007/0175506 A1 | 8/2007 | Horio et al. |
| 2008/0308140 A1 | 12/2008 | Nakamura |
| 2010/0095995 A1 | 4/2010 | Toyoda et al. |
| 2011/0083711 A1 | 4/2011 | Plissonnier et al. |
| 2016/0027984 A1 | 1/2016 | Shiraishi et al. |

FOREIGN PATENT DOCUMENTS

| | | |
|---|---|---|
| JP | H11-257789 A | 9/1999 |
| JP | 2000-068564 A | 3/2000 |
| JP | 2003-273511 A | 9/2003 |
| JP | 2005-217353 A | 8/2005 |
| JP | 2006-040963 A | 2/2006 |
| JP | 2009-117792 A | 5/2009 |
| JP | 2009-170438 A | 7/2009 |
| JP | 2010-157645 A | 7/2010 |
| JP | 2011-508411 A | 3/2011 |
| JP | 2011-187619 A | 9/2011 |
| WO | 99/54941 A1 | 10/1999 |

OTHER PUBLICATIONS

Oct. 13, 2015 Office Action issued in Japanese Patent Application No. 2013-011513.
Jan. 26, 2017 Office Action Issued in U.S. Appl. No. 14/404,705.
Jun. 11, 2013 International Search Report issued in International Patent Application No. PCT/JP2013/062460.

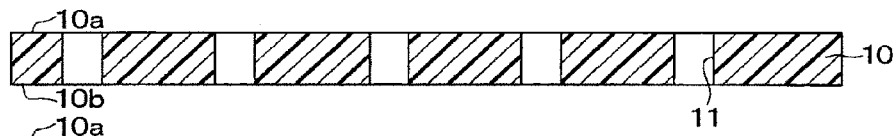
FIG. 4A
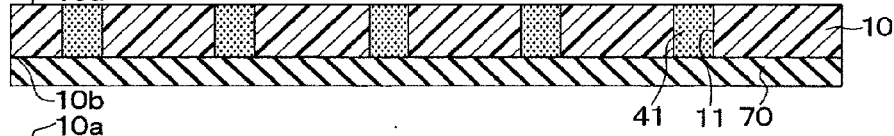
FIG. 4B
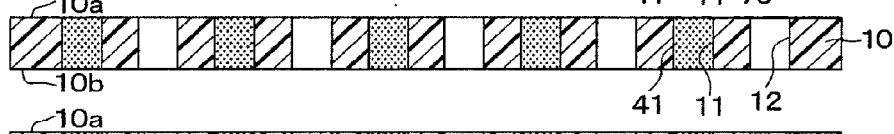
FIG. 4C
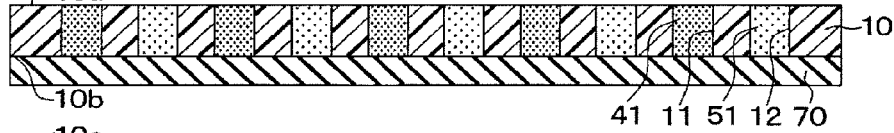
FIG. 4D
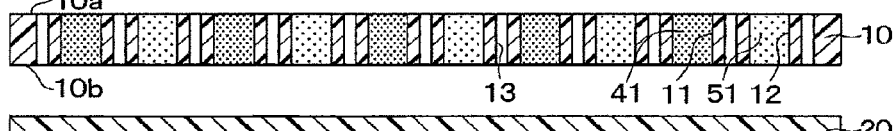
FIG. 4E
FIG. 4F
FIG. 4G
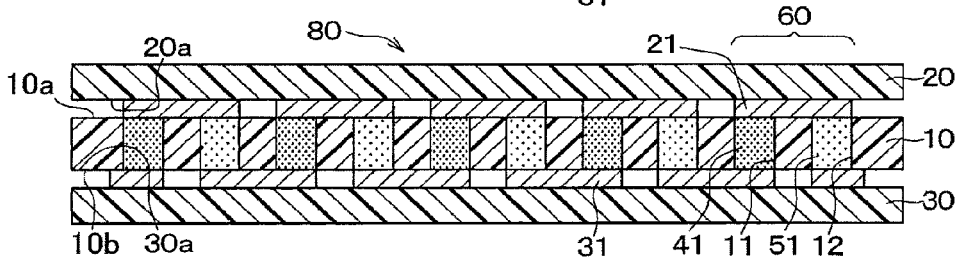
FIG. 4H
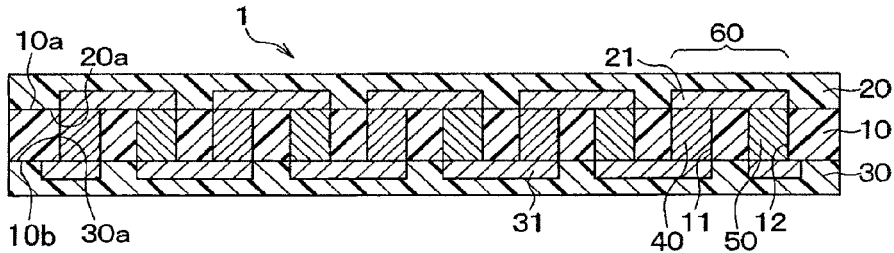
FIG. 4I

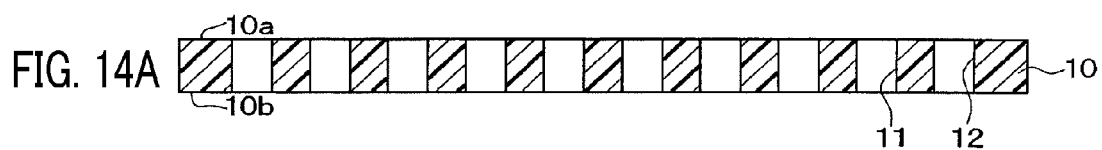
FIG. 14A
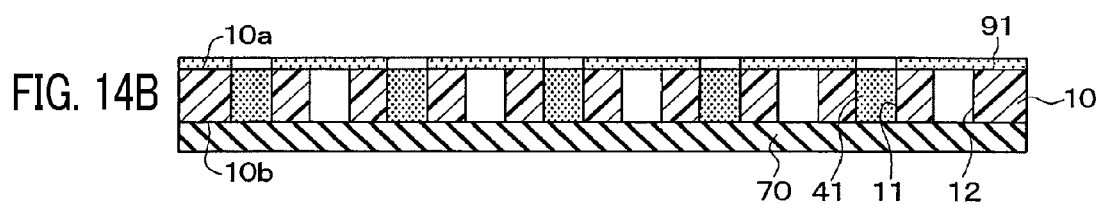
FIG. 14B
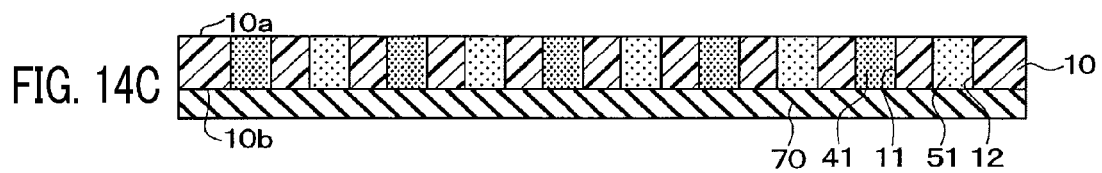
FIG. 14C
FIG.15
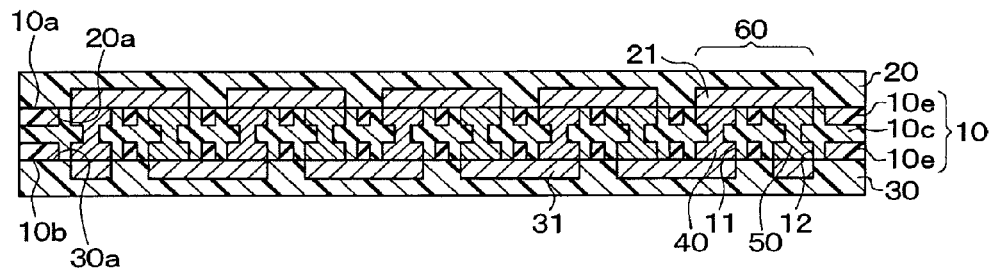

PRODUCTION METHOD OF THERMOELECTRIC CONVERTER, PRODUCTION METHOD OF ELECTRONIC DEVICE EQUIPPED WITH THERMOELECTRIC CONVERTER, AND THERMOELECTRIC CONVERTER

This is a divisional Application of application Ser. No. 14/404,705 filed Dec. 1, 2014, which is a 371 of international application of PCT/JP2013/062460 filed Apr. 26, 2013, which claims priority to JP 2013-011513 filed Jan. 24, 2013, JP 2012-122824 filed May 30, 2012. The disclosures of the prior applications are hereby incorporated by reference herein in their entirety.

TECHNICAL FIELD

The invention relates to a production method of a thermoelectric converter, a production method of an electronic device equipped with a thermoelectric converter, and a thermoelectric converter.

BACKGROUND ART

For instance, the patent literature 1 proposes the following production method of a thermoelectric converter. In the production method, open holes are formed in an insulating mold form. The open holes are regularly filled with a first conductive paste made of Bi, Te, and Se and a second conductive paste made of Bi, Sb, and Te.

A plurality of front side conductive layers are formed on the front surface of the insulating mold form in contact with the adjacent first and second conductive pastes. A plurality of reverse side conductive layers are formed on the reverse surface of the insulating mold form in contact with the first conductive pastes and the second conductive pastes which contact with the front side conductive layers which do not contact with the former first conductive pastes.

Subsequently, the insulating mold form is heat-treated within an Ar gas atmosphere at 460° C. for ten hours to make N-type thermoelectric converter devices of the conductive paste made of Bi, Te, and Se and P-type thermoelectric converter devices of the conductive paste made of Bi, Sb, and Te. At this time, the N-type thermoelectric converter devices, the P-type thermoelectric converter devices, the front side conductive layers, and the reverse side conductive layers are connected, thereby producing the thermoelectric having the N-type thermoelectric converter devices and the P-type thermoelectric converter devices connected alternately in series.

When the insulating mold form is heat-treated within the Ar gas atmosphere at 460° C. for ten hours, the N-type thermoelectric converter devices and the P-type thermoelectric converter devices (alloys) are liquid-phase sintered because melting points of Bi and Te are lower than 460° C.

PRIOR ART DOCUMENT

Patent Literature

Patent Literature: Japanese Patent First Publication No. 8-153899

SUMMARY OF THE INVENTION

Problem to be Solved by the Invention

The production method in the patent literature 1 faces the drawback in that the liquid-phase sintered alloy usually has a random crystal structure of metallic atoms, thus resulting in a difficulty in generating electric power.

It is known that use of a solid-phase sintered alloy with the thermoelectric converter enables makes it possible to produce a high electric power since the solid-phase sintered alloy is laminated while keeping a given crystal structure. The production method in the patent literature 1 may therefore be achieved by placing the insulating mold form between two press plates and pressing the front and reverse surfaces of the insulating mold form to press the first and second conductive pastes against each other for solid-phase sintering the N-type thermoelectric devices and the P-type thermoelectric devices.

In the above method, however, the pressure is evenly exerted on the insulating mold form located around the first and second conductive pastes (i.e., the open holes) as well as the first and second conductive pastes, thus resulting in inefficiency in pressing the first and second conductive pastes. A lack in pressure applied to the first and second conductive pastes may, therefore, result in a problem of a failure in forming the N-type thermoelectric converter devices and the P-type thermoelectric converter devices by the first and second conductive pastes.

The above type of problem is not encountered only by the thermoelectric converter devices equipped with the N-type and P-type thermoelectric converter devices. Specifically, the thermoelectric effect usually occurs as long as two different types of metals are connected together. The above problem, therefore, occurs in thermoelectric converters in which the open holes are filled only with conductive paste made from Bi, Te, Se, etc., and the front side conductive layer and the reserve surface conductive layer are made from material different from alloy formed by solid-phase sintering the conductive paste.

It is an object of the present invention to provide a production method of a thermoelectric converter which is capable of applying pressure to conductive paste effectively, a production method of an electronic device equipped with a thermoelectric converter, and a thermoelectric converter.

Means for Solving Problem

One aspect of the invention is characterized in that it performs: a step of preparing an insulating base (10) which contains thermoplastic resin and has formed therein a plurality of first and second via holes (11, 12) extending through a thickness thereof, the first via holes being filled with a first conductive paste (41), the second via holes being filled with a second conductive paste (51); a step of placing a front side protective member (20) on a front surface (10a) of said insulating base and also placing a reverse side protective member (20) on a reverse surface (10b) of said insulating base to make a stack body (80), the front side protective member having front side conductive layers (21) contacting given ones of the first and second conductive pastes, the reverse side protective member having reverse side conductive layers (31) contacting given ones of the first and second conductive pastes; and a uniting step of pressing the stack body in a stacking direction while heating the stack body to make first and second layer-to-layer connecting members (40, 50) of the first and second conductive pastes and also to electrically connect the first and second layer-to-layer connecting members with said front side conductive layers and said reverse side conductive layers.

A paste made by adding an organic solvent to an alloy powder in which a plurality of atoms keep a given crystal structure in a paste form is used as the first conductive paste.

A paste made by adding powder of metal which is different in kind from the alloy is used as the second conductive paste. In the step of making the stack body, cavities (13 to 17) are formed inside the stack body. In the uniting step, the cavities work to facilitate flow of said thermoplastic resin to absorb pressure acting on said first conductive pastes in a direction different from the stacking direction, thereby increasing pressure applied to the stack body in the stacking direction to solid-state sinter the first conductive pastes to make the first layer-to-layer connecting members.

The uniting step is achieved by permitting the thermoplastic resin to flow into the cavities, thus resulting in a decrease in pressure applied to peripheries of the first via holes (where the thermoplastic resin is flowing). This causes pressure which is to be originally exerted on where the thermoplastic resin is flowing to be applied to the first conductive pastes, thus resulting in elevation in pressure acting on the first conductive pastes. This enhances the efficiency in applying the pressure to the first conductive pastes. This prevents the first conducive pates from not being solid-state sintered. It is also possible to apply the pressure effectively to the second conductive pastes, thus preventing the second conductive pastes from not being solid-state sintered as needed.

Another aspect of the invention is characterized in that it performs: a step of preparing an insulating base (10) which contains thermoplastic resin and has formed therein a plurality of via holes (11, 12) extending through a thickness thereof, the via holes being filled with conductive pastes (41); a step of placing a front side protective member (20) on a front surface (10a) of said insulating base and also placing a reverse side protective member (20) on a reverse surface (10b) of said insulating base to make a stack body (80), the front side protective member having front side conductive layers (21) contacting given ones of the conductive pastes, the reverse side protective member having reverse side conductive layers (31) contacting given ones of the conductive pastes; and a uniting step of pressing the stack body in a stacking direction while heating the stack body to make layer-to-layer connecting members (40) of the conductive pastes and also to electrically connect the layer-to-layer connecting members with said front side conductive layers and said reverse side conductive layers.

A paste made by adding an organic solvent powder of alloy in which a plurality of atoms keep a given crystal structure constant is prepared. In the step of making the stack body, cavities (13 to 17) are formed inside the stack body. In the uniting step, the cavities work to facilitate flow of said thermoplastic resin to absorb pressure acting on the conductive pastes in a direction different from the stacking direction, thereby increasing pressure applied to the stack body in the stacking direction to solid-state sinter the conductive pastes to make the layer-to-layer connecting members.

This produces the thermoelectric converter having a single kind of the layer-to-layer connecting members disposed in the insulating base. In such a type of thermoelectric converter, the uniting step is performed while permitting the thermoplastic resin to flow into the cavities, thus ensuring, like in the first aspect of the invention, the effectivity in applying the pressure to the conductive pastes, which prevents the conductive pastes from not being solid-state sintered.

Another aspect of the invention is characterized in that it performs: a step of preparing an insulating base (10) which contains thermoplastic resin and has formed therein a plurality of first and second via holes (11, 12) extending through a thickness thereof, the first via holes being filled with a first conductive paste (41), the second via holes being filled with a second conductive paste (51); a step of placing a front side protective member (20) on a front surface (10a) of the insulating base and also placing a reverse side protective member (20) on a reverse surface (10b) of the insulating base to make a stack body (80), the front side protective member containing thermoplastic resin and having front side conductive layers (21) contacting given ones of the first and second conductive pastes, the reverse side protective member containing thermoplastic resin and having reverse side conductive layers (31) contacting given ones of the first and second conductive pastes; and a uniting step of pressing the stack body in a stacking direction while heating the stack body to make first and second layer-to-layer connecting members (40, 50) of the first and second conductive pastes and also to electrically connect the first and second layer-to-layer connecting members with the front side conductive layers and the reverse side conductive layers.

A paste made by adding an organic solvent to powder of alloy in which a plurality of atoms keep a given crystal structure constant is used as the first conductive paste. A paste made by adding an organic solvent to powder of metal which is different in kind from the alloy is used as the second conductive paste. In the uniting step, the stack body is pressed using two press plates (90) which have recesses (90a) formed in portions thereof which face the front surface of the insulating base and/or portions thereof which face the reverse surface of the insulating base. At least one of the thermoplastic resins of which the front side protective member and the reverse side protective member are made is permitted to flow into the recesses while permitting the thermoplastic resin of which the insulating base is made to move to solid-state sinter the first conductive pastes to make the first layer-to-layer connecting members.

In the uniting step achieved by using the two press plates in which the recesses are formed, the thermoplastic resin of which the insulating base is made is permitted to flow, thus enhancing, like in the first aspect of the invention, the efficiency in applying the pressure to the first conductive pastes. This prevents the conductive pastes from not being solid-state sintered.

Another aspect of the invention is characterized in that it performs: a step of preparing an insulating base (10) which contains thermoplastic resin and has formed therein a plurality of first and second via holes (11, 12) extending through a thickness thereof, the first via holes being filled with a first conductive paste (41), the second via holes being filled with a second conductive paste (51); a step of placing a front side metallic plate (21a on a front surface (10a) of the insulating base and also placing a reverse side metallic plate (31a) on a reverse surface (10b) of the insulating base to make a stack body (80); a uniting step of pressing the stack body in a stacking direction while heating the stack body to make first and second layer-to-layer connecting members (40, 50) of the first and second conductive pastes and also to electrically connect the first and second layer-to-layer connecting members with the front side metallic plate and the reverse side metallic plate; and a step of subjecting the front side metallic plate and the reverse side metallic plate to die cutting to form a plurality of front side conductive layers (21) and reverse side conductive layers (31) which electrically connect with the given first and second layer-to-layer connecting members.

A paste made by adding an organic solvent to powder of alloy in which a plurality of atoms keep a given crystal structure constant is used as the first conductive pastes. A paste made by adding an organic solvent to powder of metal which is different in kind from the alloy is used as the second conductive pastes. The step of making the stack body forms cavities (13 to 17) inside the stack body. In the uniting step, the cavities work to facilitate flow of the thermoplastic resin to absorb pressure acting on the first conductive pastes in a direction different from the stacking direction, thereby increasing pressure applied to the stack body in the stacking direction to solid-state sinter the first conductive pastes to make the first layer-to-layer connecting members.

As apparent from the above discussion, the front side metallic plate is placed on the front surface of the insulating base, while the reverse side metallic plate is placed on the reverse surface of the insulating base. After the stack body is united, the front side conductive layers and the reverse side conductive layers are formed. The uniting step is achieved while permitting the thermoplastic resin to flow into the cavities, thus ensuring, like in the first aspect of the invention, the effectivity in applying the pressure to the conductive pastes, which prevents the conductive pastes from not being solid-state sintered.

Another aspect of the invention is characterized in that it comprises: a front side protective member (20) equipped with a plurality of front side conductive layers (21); a reverse side protective member (30) equipped with a plurality of reverse side conductive layers (31); an insulating base (10) which has a plurality of first and second via holes (11, 12) which extend through a thickness thereof, the insulating base containing thermoplastic resin; first layer-to-layer connecting members (40) which are disposed in the first via holes (11) and made of alloy in which a plurality of atoms keep a given crystal structure constant; and second layer-to-layer connecting members (50) which are disposed in the second via holes (12) and made of metal different in kind from the alloy, also in that when the first layer-to-layer connecting member disposed in each of the first via holes and the second layer-to-layer connecting member disposed in an adjacent one of the second via holes is defined as a pair (60), the front side protective member is placed on the front surface of the insulating base with the first layer-to-layer connecting member and the second layer-to-layer connecting member of each of the pairs being in contact with the same one of the front side conductive layers, and the reverse side protective member is placed on the reverse surface of the insulating base with the first conductive paste in one of adjacent two of the pairs and the second conductive paste in the other pair being in contact with the same one of the reverse side conductive layers, and in that the insulating base surrounds peripheries of the first layer-to-layer connecting members and the second layer-to-layer connecting members.

The first layer-to-layer connecting members are made of an alloy in which the plurality of atoms keep the given crystal structure constant, thus enabling a large amount of electric power to be generated. The insulating base which contains the thermoplastic resin is disposed around peripheries of the first layer-to-layer connecting members and the second layer-to-layer connecting members, thereby improving adhesion between the first and second layer-to-layer connecting members and the front side conductive layers and between the first and second layer-to-layer connecting members and the reverse side conductive layers, which enables a larger amount of electric power to be generated.

Symbols in brackets for means, as described in the above column and claims, represent relationships with specific means as referred to in embodiments discussed later.

BRIEF EXPLANATION OF DRAWINGS

FIGS. 4(a) to 4(i) are sectional views showing a production method of the thermoelectric converter of FIG. 1;

FIGS. 14(a) to 14(c) are sectional views showing a production method of preparing an insulating base in the seventh embodiment of the invention;

FIG. 15 is a sectional view of a thermoelectric converter in the eighth embodiment of the invention;

EMBODIMENT FOR CARRYING OUT THE INVENTION

Embodiments of the invention will be described based on drawings. In the following discussion, same or equivalent parts will be indicated by the same symbols.

First Embodiment

Figure 1:
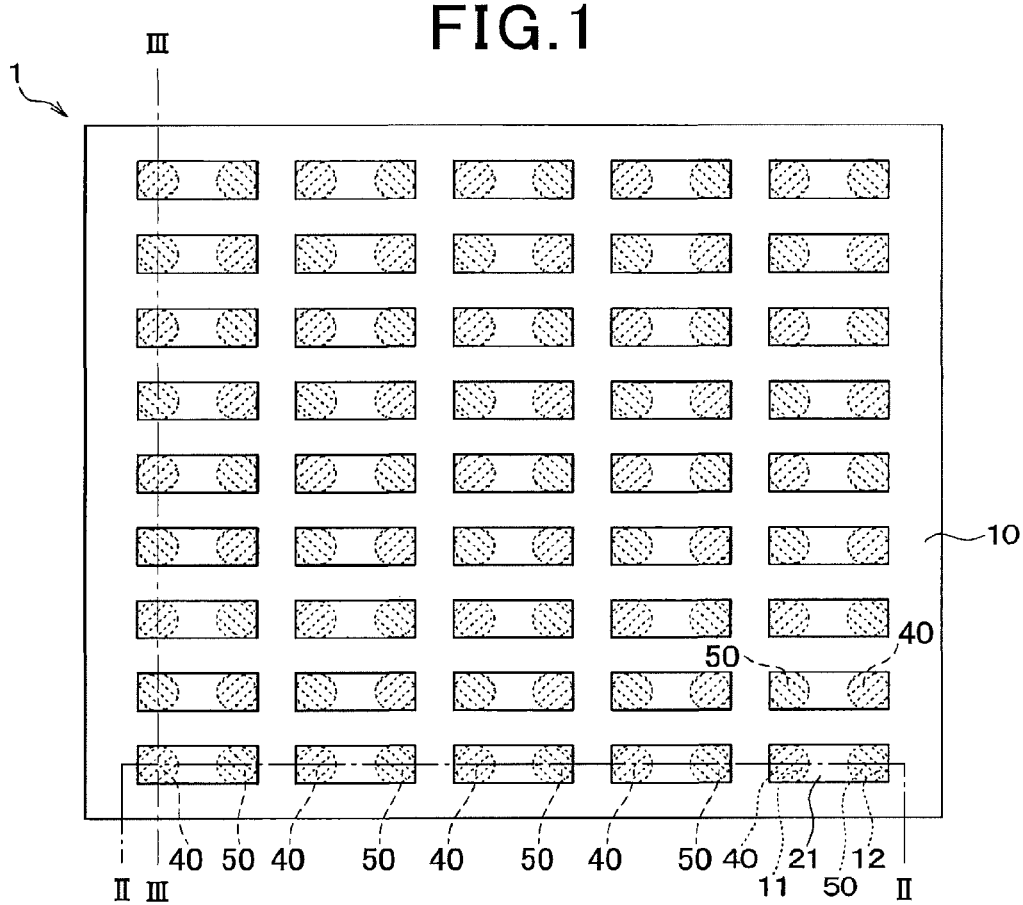
FIG. 1 is a plane view of a thermoelectric converter in the first embodiment of the invention.
Figure 2:
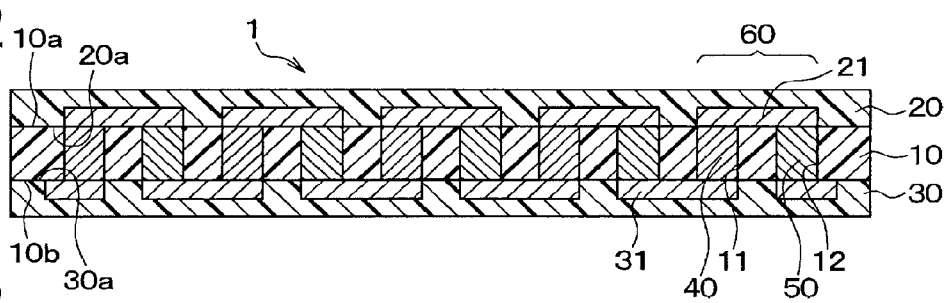
FIG. 2 is a sectional view, as taken along the line II-II in FIG. 1.
Figure 3:
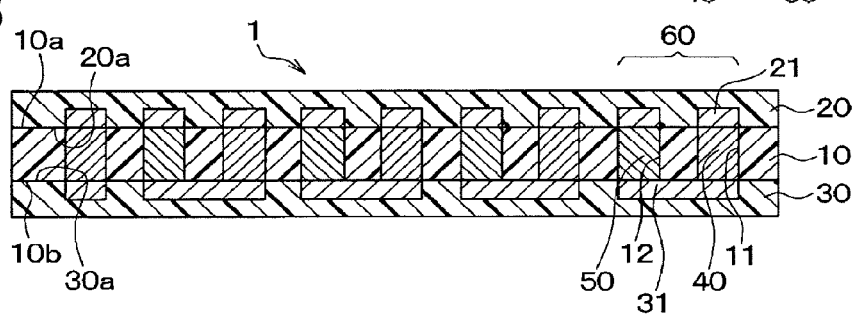
FIG. 3 is a sectional view, as taken along the line III-III in FIG. 1.

A thermoelectric converter 1 according to the first embodiment of the invention will be described below with reference to drawings. The thermoelectric converter 1, as illustrated in FIGS. 1 to 3, includes an insulating base 10, a front side protective member 20, a reverse side protective member 30, and a plurality of first and second layer-to-layer connecting members 40 and 50. The insulating base 10, the front side protective member 20, and the reverse side protective member 30 are connected together in a multi-layered form, i.e., united. In this united assembly, a plurality of connector arrays made up of the first and second layer-to-layer connecting members 40 and 50 connecting between the front side protective member 20 and the reverse side protective member 30 extend in a horizontal direction, as viewed in the drawing. Each of the first layer-to-layer connecting members 40 is made of material different from that of the second layer-to-layer connecting members 50. In each of the connector arrays, the first layer-to-layer connecting members 40 and the second layer-to-layer connecting members 50 are alternately connected in series.

FIG. 1 omits the front side protective member 20 for the sake of ease of understanding. FIG. 1 is not a sectional view, but hatches the first layer-to-layer connecting members 40 and the second layer-to-layer connecting members 50 using lines which are different in orientation between the first layer-to-layer connecting members 40 and the second layer-to-layer connecting members 50.

The insulating base 10 is formed by a rectangular planar thermoplastic resin film containing polyether ether ketone (PEEK) and polyetherimide (PEI). The insulating base 10 has formed therein a plurality of first and second via holes 11 and 12 extending through a thickness thereof. The first and second via holes 11 and 12 are arranged alternately in each array extending in the horizontal direction in FIG. 1.

The first and second via holes 11 and 12 are cylindrical to have a diameter constant from the front surface 10a to the reverse surface 10b of the insulating base 10, but may alternatively be of a tapered shape in which the diameter decreases from the front surface 10a to the reverse surface 10b or a rectangular cylindrical shape.

In each of the first via holes 11, one of the first layer-to-layer connecting members 40 is disposed. Similarly, the second layer-to-layer connecting members 50 are disposed one in each of the second via holes 12. The second layer-to-layer connecting members 50 are made of a metallic material different from that of the first layer-to-layer connecting members 40. Specifically, in the insulating base 10, the first and second layer-to-layer connecting members 40 and 50 are arranged alternately in each horizontal array extending in the horizontal direction, as viewed in FIG. 1 and also alternately in each vertical array extending in a vertical direction, as viewed in FIG. 1. For instance, in the lowermost array of FIG. 1, the second layer-to-layer connecting member 50, the first layer-to-layer connecting member 40, the second layer-to-layer connecting member 50 etc. are arranged in this order from the right side. In the second array from the bottom of FIG. 1, the first layer-to-layer connecting member 40, the second layer-to-layer connecting member 50, the first layer-to-layer connecting member 50, the first layer-to-layer connecting member 50 etc. are arranged from the right side in this order.

Although not limited to, the first layer-to-layer connecting members 40 are made of, for example, a conductive paste containing power (metallic particles) of a P-type Bi—Sb—Te alloy. The second layer-to-layer connecting members 50 are made of a conductive paste containing powder (metallic particles) of a N-type Bi—Te alloy.

On the front surface 10a of the insulating base 10, the front side protective member 20 is disposed which is made of a rectangular planar thermoplastic resin film containing polyether ether ketone (PEEK) and polyetherimide (PEI). The front side protective member 20 is identical in size of planar configuration with the insulating base 10. The front side protective member 20 has a plurality of patterned front side conductive layers 21 formed in a surface 20a thereof facing the insulating base 10. The front side conductive layers 21 are made of a copper foil. The front side conductive layers 21 are separate from each other. Each of the front side conductive layers 21 is electrically connected to the first and second layer-to-layer connecting members 40 and 50.

Specifically, each of the first layer-to-layer connecting members 40 and an adjacent one of the second layer-to-layer connecting members 50 constitute a pair 60. The first and second layer-to-layer connecting members 40 and 50 of each pair 60 are connected to the same one of the front side conductive layers 21. In other words, the first and second layer-to-layer connecting members 40 and 50 of each pair 60 are electrically connected together through the front side conductive layer 21. In this embodiment, each of the pairs 60 is made up of one of the first layer-to-layer connecting members 40 and one of the second layer-to-layer connecting members 50 which are located adjacent each other in a longitudinal direction (i.e., the horizontal direction in FIG. 1) of the insulating base 10.

On the reverse surface 10b of the insulating base 10, the reverse side protective member 30 is disposed which is made of a rectangular planar thermoplastic resin film containing polyether ether ketone (PEEK) and polyetherimide (PEI). The reverse side protective member 30 is identical in size of planar configuration with the insulating base 10. The reverse side protective member 30 has a plurality of patterned reverse side conductive layers 31 formed in a surface 30a thereof facing the insulating base 10. The reverse side conductive layers 31 are made of a copper foil. The reverse side conductive layers 31 are separate from each other. Each of the reverse side conductive layers 31 is electrically connected to the first and second layer-to-layer connecting members 40 and 50.

Specifically, the first layer-to-layer connecting member 40 of one of adjacent two of the pairs 60 is connected to the second layer-to-layer connecting member 50 of the other pair 60 through the same one of the revere side conductive layers 31. In other words, the first and second layer-to-layer connecting members 40 and 50 of two of the pairs 60 which are arranged adjacent each other in the horizontal direction are electrically connected together through the reverse side conductive layer 31.

In the structure of FIG. 2, two of the pairs 60 arranged in the longitudinal direction of the insulating base 10 (i.e., the horizontal direction in FIG. 1) are the adjacent pairs 60, as referred to above. In the right and left sides of the insulating base 10 in FIG. 3, two of the pairs 60 which are arranged along the short side of the insulating base 10 (i.e., the vertical direction in FIG. 1) are the adjacent pairs 60, as referred to above.

In other words, in each of the above described horizontal arrays extending in the longitudinal direction of the insulating base 10 (i.e., the horizontal direction in FIG. 2), the first and second layer-to-layer connecting members 40 and 50 are, as can be seen from FIG. 2, connected in series with each other. The first layer-to-layer connecting member 40 or the second layer-to-layer connecting member 50 which lies at either of the right or left side of each of the horizontal arrays is, as can be seen from FIG. 3, connected to the second layer-to-layer connecting member 50 or the first layer-to-layer connecting member 40 which is arranged adjacent thereto in the upper or lower direction, thereby achieving the overall serial connection of the first layer-to-layer connecting member 40 and the second layer-to-layer connecting member 50.

In a cross section of the thermoelectric converter 1 other than those of FIGS. 2 and 3, a layer-to-layer connecting member is formed on the reverse side protective member 30. The layer-to-layer connecting member is electrically connected to the reverse side conductive layer 31 and also exposed outside the surface of the reverse side protective member 30 which is farther away from the insulating base 10. The layer-to-layer connecting member is used for external electrical connection.

The thermoelectric converter 1 has the above described structure. For instance, in the case where the diameter of the first and second via holes 11 and 12 is 0.7 mm, the thickness of the insulating base 10 is 1 mm, and a total of about 900 first and second layer-to-layer connecting members 40 and 50 are arranged, the thermoelectric converter 1 is capable of producing about 2.5 mW electric power at a temperature difference of 10° C.

Next, a production method of the thermoelectric converter 1 will be described below with reference to FIGS. 4(a) to 4(i), FIGS. 4(a) to 4(i) are sectional view, as taken along the line II-II in FIG. 1.

First, the insulating base 10 is prepared. The plurality of first via holes 11 are, as illustrated in FIG. 4(a), drilled in the insulating base 10.

Next, the first conductive paste 41 is put in each of the first via holes 11.

The method (or machine) for filling the via holes 11 with the first conductive pastes 41 may be achieved by one as taught in Japanese Patent Application No. 2010-50356 filed by the same applicant as that of this application.

In short, the insulating base 10 is placed on a holding table, not shown, through adsorbent paper 70 with the reverse surface 10a facing the adsorbent paper 70. The adsorbent paper 70 may be made of material capable of adsorbing the organic solvent of the first conductive paste 41 and is common high-quality paper. The first conductive paste 41 is melted and loaded into the first via holes 11. Most of the organic solvent of the first conductive paste 41 is then collected by the adsorbent paper 70, so that the metallic particles are arranged in close contact with each other in the first via holes 11.

The first conductive paste 41 is made by adding an organic solvent, such as paraffin whose melting point is about 43° C., to particles of alloy in which metallic atoms keep a given crystal structure constant to make a paste form. Therefore, the pouring of the first conductive paste 41 is achieved while the front surface 10a of the insulating base 10 is being heated at about 43° C. As the particles of alloy used for making the first conductive paste 41, Bi—Sb—Te, as formed by mechanical alloying, may be used.

Subsequently, the plurality of via holes 12 are, as shown in FIG. 4(c), drilled in the insulating base 10. The second via holes 12 are, as described above, arranged alternately with the first via holes 11 in a staggered arrangement.

Next, the insulating base 10 is, as illustrated in FIG. 4(d), placed again on the holding table, not shown, through the adsorbent paper 70 with the reverse surface 10a facing the adsorbent paper 70. Like in applying the first conductive paste 41, the second conductive paste 51 is applied into the second via holes 12. Most of the organic solvent of the second conductive paste 41 is then collected by the adsorbent paper 70, so that the metallic particles are arranged in close contact with each other in the second via holes 12.

The second conductive paste 51 is made by adding organic solvent, such as terpineol whose melting point is room temperature, to particles of alloy in which metallic atoms, as different in kind from those of the first conductive paste 41, keep a given crystal structure constant. In other words, the organic solvent of the second conductive paste 51 is lower in melting point than that of the first conductive paste 41. The applying of the second conductive paste 51 is, thus, achieved while the front surface 10a of the insulating base 10 is being heated at room temperature. In other words, the applying of the second conductive paste 51 is achieved in the condition where the organic solvent contained in the first conductive paste 41 is solidified. This avoids the entry of the second conductive paste 51 into the first via holes 11. As the particles of alloy used for making the second conductive paste 51, Bi—Te, as formed by mechanical alloying, is used.

The insulating base 10 filled with the first and second conductive pastes 41 and 51 is prepared in the above way.

Figure 5:
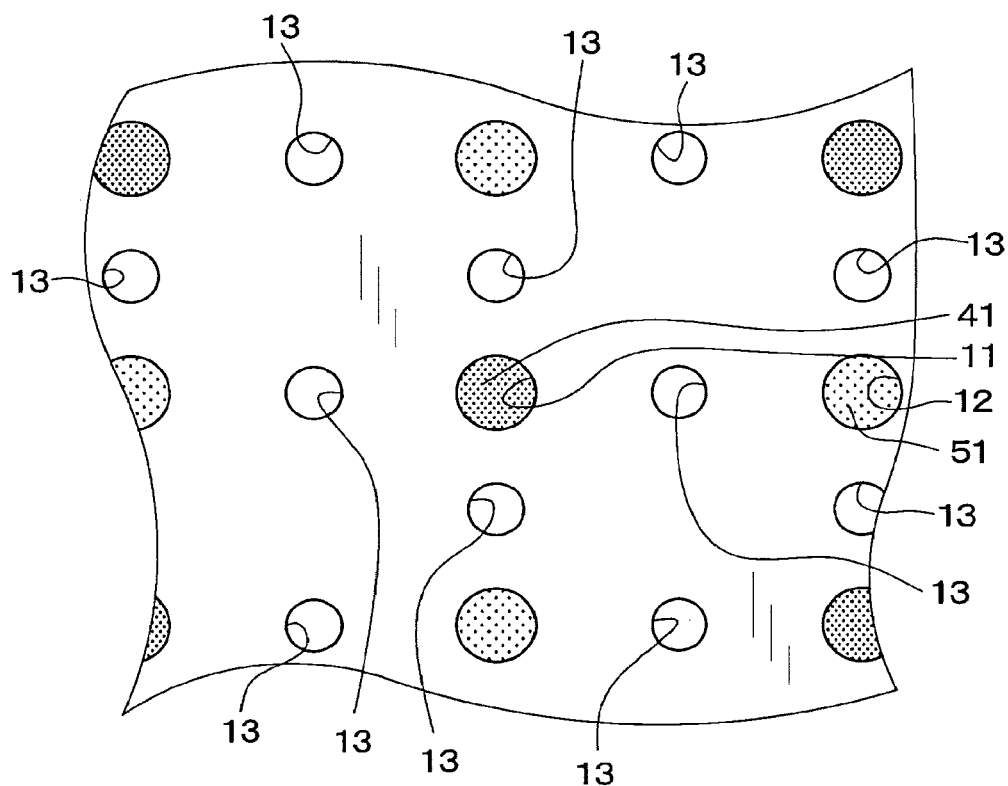
FIG. 5 is a plane view on a front side of an insulating base illustrated in FIG. 4(e)

Next, a plurality of through holes 13 are, as illustrated in FIG. 4(c), formed in the insulating base 10 as cavities by drilling or using a laser. The through holes 14 are, as illustrated in FIGS. 4(e) and 5, preferably arranged at equal intervals away from each other in a circumferential direction of a circle concentric with each of the first and second via holes 11 and 12.

Each of the through holes 13 is of a cylindrical shape, but may alternatively be of a tapered shape in which the diameter decreases from the front surface 10a to the reverse surface 10b.

In a process other than the above ones, copper foils are, as illustrated in FIGS. 4(f) and 4(g), formed using the patterning technique on the surfaces 20a and 30a of the front side protective member 20 and the reverse side protective member 30 which face the insulating base 10. This makes the front side protective member 20 on which the front side conductive layers 21 are formed at an interval away from each other, and the reverse side protective member 30 on which the reverse side conductive layers 31 are formed at an interval away from each other.

Afterward, the reverse side protective member 30, the insulating base 10, and the front side protective member 20 are, as illustrated in FIG. 4(h), laid to overlap each other to make a stack body 80. Specifically, the first conductive paste 41 in each of the first via holes 11 is, as described above, combined with the second conductive paste 51 in an adjacent one of the second via holes 12 to make the pair 60. The front side protective member 20 is placed on the front surface 10a of the insulating base 10 with the first and second conductive pastes 41 and 51 of each of the pairs 60 being in contact with the same one of the front side conductive layers 21. In this embodiment, the first conductive paste 41 in each of the first via holes 11 and the second conductive paste 51 in one of the second via holes 12 which is arranged adjacent in the longitudinal direction of the insulating base 10 (i.e., the horizontal direction in FIG. 1) are, as described above, combined to make each of the pairs 60.

The reverse side protective member 30 is placed on the reverse surface 10b of the insulating base 10 with the first conductive paste 41 of one of every adjacent two of the pairs 60 and the second conductive paste 51 of the other pair 60 being in contact with the same one of the reverse side conductive layers 31. The adjacent two of the pairs 60 are, as described above, two of the pairs 60 arranged in the longitudinal direction of the insulating base 10 (i.e., the horizontal direction in FIG. 1) In the right and left sides of the insulating base 10, two of the pairs 60 which are arranged along the short side of the insulating base 10 (i.e., the vertical direction in FIG. 1) are the adjacent two of the pairs 60.

Subsequently, the stack body 80 is, as illustrated in FIG. 4(i), interposed between two press plates, not shown. The upper and lower surfaces of the stack body 80 are then pressed in the stacking direction, i.e., a thickness-wise direction of the stack body 80 while the stack body 80 is being heated in a vacuum to unify the insulating base 10, the front side protective member 20, and the reverse side protective member 30, thereby completing the heat generating device 1. Although not limited to the following, the unifying of the insulating base 10, the front side protective member 20, and the reverse side protective member 30 may be achieved by placing a damper such as rock wool paper between the stack body 80 and the press plates. Assembling processes for the heat generating device 1 of this embodiment will be described below in detail with reference to FIGS. 6, 7(a) to 7(d).

Figure 6:
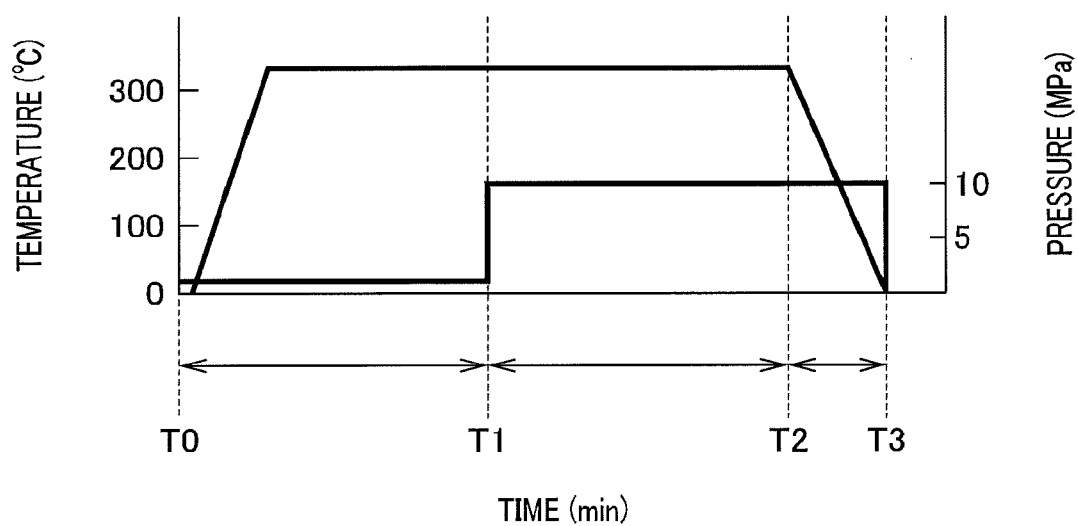
FIG. 6 is a view representing production conditions in a uniting step of FIG. 4(i)
Figure 7A:
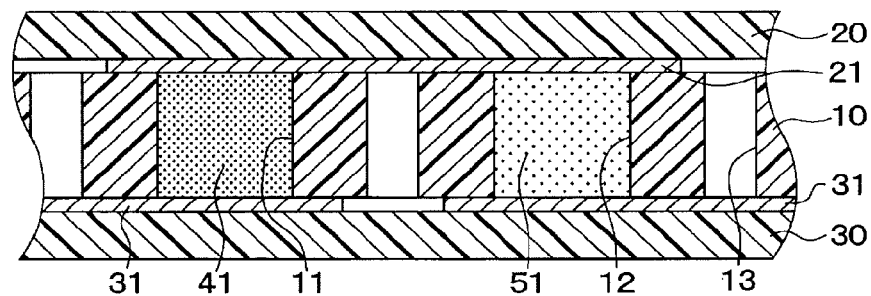
FIGS. 7(a) to 7(d) are detailed sectional views in a uniting step of FIG. 4(i)

First, the stack body 80 is, as shown in FIG. 6, pressed under 0.1 Mpa until time T1 while being heated at about 320° C. to evaporate the organic solvents contained in the first and second conductive pastes 41 and 51 (see FIG. 7(a)).

An interval between times T0 and T1 is about ten minutes. The organic solvents in the first and second conductive pastes 41 and 51 are portions of the organic solvents which are left without having been collected by the adsorbent paper 70 in the steps of FIGS. 4(b) and 4(d).

Figure 7B:
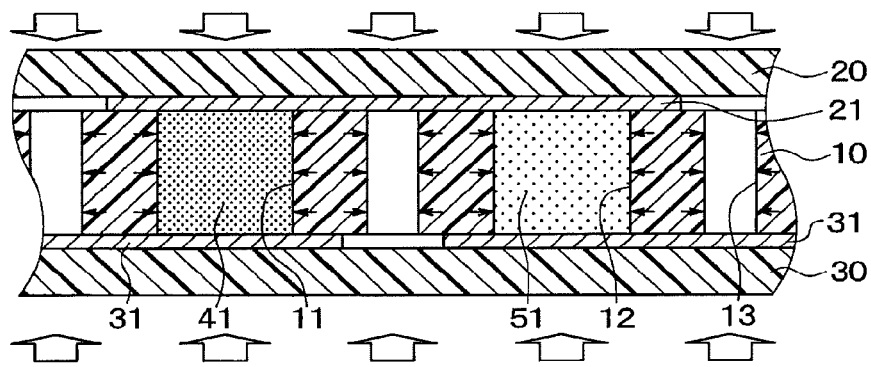
Figure 7C:
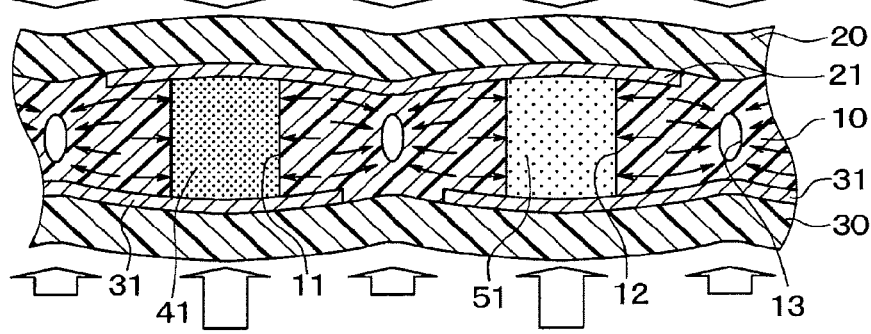

The stack body 80 (i.e., the assembly of the insulating base 10, the front side protective member 20, and the reverse side protective member 30) is, as illustrated in FIGS. 6 and 7(b), kept at approximately 320° C. that is higher than the softening point of the thermoplastic resin and pressed at 10 MPa until time T2. At this time, the thermoplastic resin of which the insulating base 10 is made melts and flows. This causes the first and second conductive pastes 41 and 51 (i.e., particles of alloy) in the first and second via holes 11 and 12 to be pressed in a lateral direction (i.e., a radial direction) thereof, thus resulting in, as illustrated in FIG. 7(c), a decrease in diameter of the first and second via holes 11 and 12. The flow of the thermoplastic resin results in deformation of the through holes 13, which leads to a decrease in volume thereof. This absorbs the pressure exerted on peripheries of the first and second via holes 11 and 12, so that it drops. This drop in pressure results in an increase in pressure applied to the first and second conductive pastes 41 and 51 in the vertical direction, that is, elevation in pressure exerted by the press plates on the first and second conductive pastes 41 and 51. The direction in which the stack body 80 is pressed in FIG. 7(b) at 10 Mpa is referred to herein as the stacking direction that is the direction in which the insulating base 10, the front side protective member 20, and the reverse side protective member 30 are stacked. The direction in which the pressure, as resulting from the melting of the thermoplastic resin of which the insulating base 10 is made, is applied to the first and second conductive pastes 41 and 51 in the first and second via holes 11 and 12 (i.e., the lateral direction in FIG. 7(c)) will also be referred to as a direction different from the stacking direction.

Figure 7D:
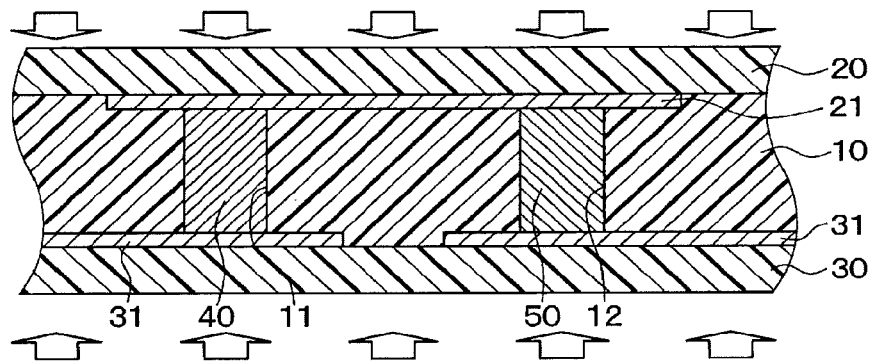

The particles of the alloy are, as illustrated in FIG. 7(d), pressed against each other and the front and reverse side conductive layers 21 and 31 and sintered in a solid state to make the first and second layer-to-layer connecting members 40 and 50. Simultaneously, the first and second layer-to-layer connecting members 40 and 50 are electrically connected to the front side conductive layers 21 and the reverse side conductive layers 31.

The interval between times T1 to 72 is about ten minutes. The organic solvents evaporate from the first and second via holes 11 and 12 so that cavities will be formed. The cavities are usually very small and do not disturb the solid-state sintering of the first and second layer-to-layer connecting members 40 and 50.

Afterwards, the stack body 80 made up of the insulating base 10, the front side protective member 20, and the reverse side protective member 30 is cooled until T3 while the pressure exerted on the stack body 80 made up of the insulating base 10, the front side protective member 20, and the reverse side protective member 30 is being kept at 10 Mpa. This produces the thermoelectric converter 1, as shown in FIG. 1, in which the insulating base 10, the front side protective member 20, and the reverse side protective member 30 are united. An interval between times T2 and T3 is approximately 8 minutes.

As described above, in the production process of the thermoelectric converter 1, the plurality of through holes 13 are formed in the insulating base 10. The insulating base 10 is heated to create a flow of the thermoplastic resin that is material of the insulating base 10, thereby decreasing the volume of the through holes 13, which further accelerates the flow of the thermoplastic resin. This results in a decrease in pressure applied to the peripheries of the first and second via holes 11 and 12, which causes the pressure exerted on the first and second conductive pastes 41 and 51 the vertical direction to be increased. It is, thus, possible to effectively apply the pressure to the first and second conductive pastes 41 and 51 for ensuring the stability in achieving the solid-state sintering of the first and second conductive pastes 41 and 51.

The plurality of through holes 13 are arranged at regular intervals away from each other in the circumferential direction of a circle concentric with each of the first and second via holes 11 and 12. This facilitates the flow of the thermoplastic resin around the first and second via holes 11 and 12 so as to decrease the size of the through holes 13 isotropically when the stack body 80 is formed, thus avoiding the displacement of the first and second via holes 11 and 12 in the planar direction of the stack body 80. This ensures the stability of conduction between the first and second layer-to-layer connecting members 40 and 50 made of the first and second conductive pastes 41 and 51 and the front side conductive layer 21 and between the first and second layer-to-layer connecting members 40 and 50 and the reverse side conductive layer 31.

The production of the thermoelectric converter 1 working to achieve a desired heat exchanger effectiveness may be made simply by changing the planar size or thickness of the insulating base 10 or the number or diameter of the first and second via holes 11 and 12. There is, thus, no need for increasing the production steps or the complexity of the production of the thermoelectric converter 1 depending upon the intended use thereof, thereby improving the degree of freedom of design of the thermoelectric converter 1.

The thermoelectric converter 1 of this embodiment has the first and second layer-to-layer connecting members 40 and 50 made of alloy in which a plurality of metallic atoms keep the crystal structure constant and thus works to generate a great deal of electric power. The peripheries of the first layer-to-layer connecting member 40 and the second layer-to-layer connecting member 50 are surrounded by the insulating base 10 made of material containing thermoplastic resin, thus improving the adhesion between the first layer-to-layer connecting member 40 and the second layer-to-layer connecting member 50 and between the front side conductive layer 21 and the reverse side conductive layer 31. This enables a greater deal of electric power to be produced.

The insulating base 10 is disposed between the front side conductive layer 21 (i.e., the front side protective member 20) and the reverse side conductive layer 31 (i.e., the reverse side protective member 30), so that there is no flow of air between the front side conductive layer 21 (i.e., the front side protective member 20) and the reverse side conductive layer 31 (i.e., the reverse side protective member 30), thereby minimizing a difference in heat between them.

A multi-layer board made up of a plurality of resin films is known which has formed therein via holes with a bottom surface defined by wiring pattern made of a copper foil and also has layer-to-layer connecting members disposed in the via holes. Such a type of multi-layer board is manufactured in the following way.

First, a plurality of resin films in which have formed therein via holes with a bottom surface defined by wiring pattern made of a copper foil is prepared. The via holes are filled with a conductive paste containing Sn. The plurality of resin films are laid to overlap each other to make a film stack. The film stack is pressed while being heated in a vacuum and then united as a stack body. Simultaneously, the conductive pastes are sintered to make layer-to-layer connecting members which are electrically joined to the wiring pattern.

The above assembling process, however, disperses Sn contained in the conductive paste over the wiring pattern to join the layer-to-layer connecting members (i.e., the conductive pastes) and the wiring pattern. In other words, since it is impossible to join the metallic particles directly to each other, the stack body is formed under a maximum pressure of 4 Mpa. It is, therefore, impossible to make such a type of multi-layer board using the production method of this embodiment by which the thermoelectric converter 1 is formed using a larger pressure.

In this embodiment, the first conductive paste 41 is formed by powder of Bi—Sb—Te alloy. The second conductive paste 51 is made of power of Bi—Te alloy. The kinds of alloy are not limited to them. For instance, the power of alloy making the first and second conductive pastes 41 and 51 may be selected from copper, constantan, chromel, or alumel alloyed with iron, nickel, chrome, copper, or silicon or from alloy of tellurium, bismuth, and antimony or alloy of selenium, silicon, iron, and aluminum.

Second Embodiment

The second embodiment of the invention will be described below. The thermoelectric converter 1 of this embodiment is different in configuration of cavities formed in the insulating base 10 from the first embodiment. Other arrangements are identical, and explanation thereof in detail will be omitted here.

Figure 8:
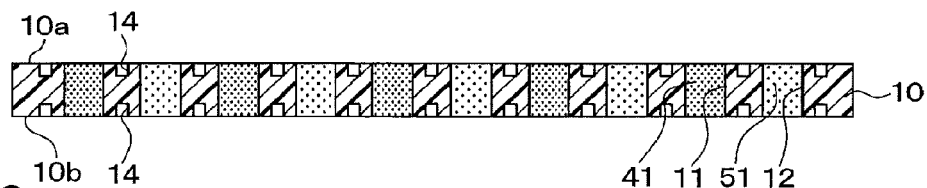
FIG. 8 is a sectional view corresponding to FIG. 4(e) in the second embodiment of the invention.
Figure 9:
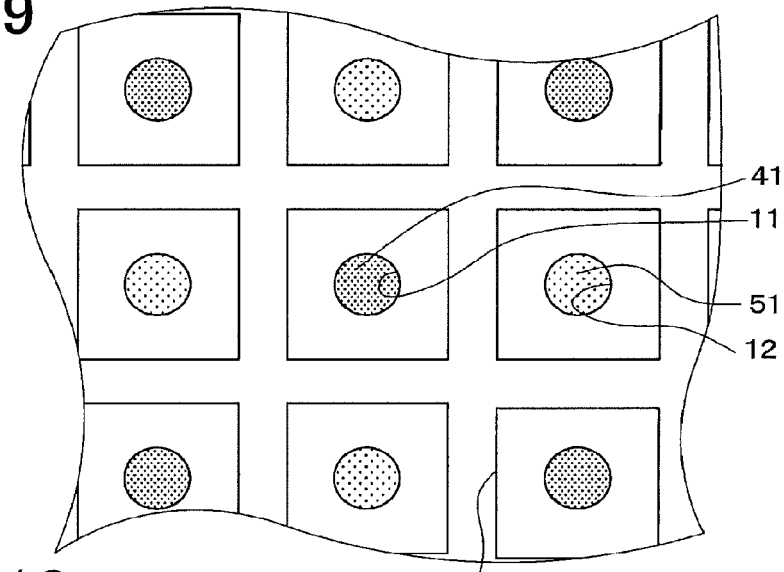
FIG. 9 is a plane view on a front side of an insulating base of FIG. 8.

In the step of FIG. 4(*e*), a square closed loop like groove 14 is, as illustrated in FIGS. 8 and 9, formed in the insulating base 10 around each of the first and second via holes 11 and 12. Specifically, the grooves 14 are formed in the front surface 10*a* of the insulating base 10 so that the first and second via holes 11 and 12 lie one in each of the grooves 14. Similarly, the grooves 14 are formed in the reverse surface 10*b* of the insulating base 10 so that the first and second via holes 11 and 12 lie one in each of the grooves 14.

In this embodiment, the grooves 14 define the cavities. The grooves 14 surrounding the first and second via holes 11 and 12 are arranged in a grid pattern, however, the shape of the grooves 14 may alternatively be other than square. For instance, the grooves 14 may extend directly. Further, the grooves 14 formed in the front surface 10*a* and the reverse surface 10*b* of the insulating base 10 are identical in size with each other. The first and second via holes 11 and 12 lie at the centers of the grooves 14, respectively.

In the step of FIG. 4(*i*) making the stack body 80, the configuration of the grooves 14 of the insulating base 10 is changed by the flow of thermoplastic resin, thereby absorbing the pressure applied to the grooves 14, which causes the pressure exerted on the first and second conductive pastes 41 and 51 to be elevated. The same beneficial effects as those in the first embodiment are, therefore, obtained.

The grooves 14 are made in both the front surface 10*a* and the reverse surface 10*b* of the insulating base 10, however, may be formed either one of the front surface 10*a* and the reverse surface 10*b*.

Third Embodiment

The third embodiment of the invention will be described below. The thermoelectric converter 1 of this embodiment is different in configuration of cavities formed in the insulating base 10 from the first embodiment. Other arrangements are identical, and explanation thereof in detail will be omitted here.

Figure 10:
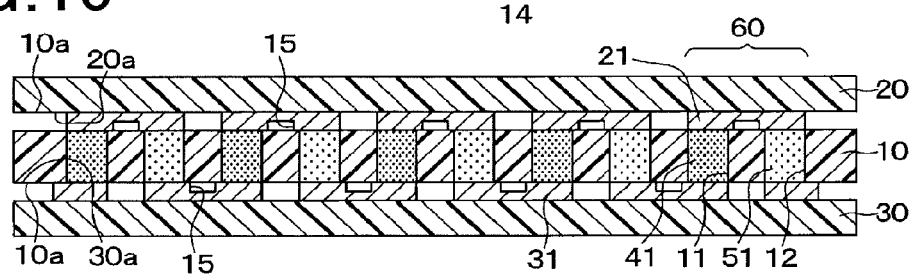
FIG. 10 is a sectional view corresponding to FIG. 4(h) in the third embodiment of the invention.

The step of FIG. 4(*e*) is, can be seen from FIG. 10, omitted. In the steps of FIGS. 4(*f*) and 4(*g*), recesses 15 are formed in portions of the front side conductive layers 21 and the reverse side conductive layers 31 which are not in contact with the first and second conductive pastes 41 and 51. In other words, the stack body 80 is produced in which the recesses 15 lie in portions of the front side conductive layers 21 and the reverse side conductive layers 31 which face the thermoplastic resin of which the insulating base 10 is made.

When the stack body 80 is made, the configuration of the recesses 15 formed in the front side conductive layers 21 and the reverse side conductive layers 31 is changed by the flow of thermoplastic resin, thereby absorbing the pressure applied to the recesses 15, which causes the pressure exerted on the first and second conductive pastes 41 and 51 to be increased. The same beneficial effects as those in the first embodiment are, therefore, obtained.

The recesses 15 are made in both the front side conductive layers 21 and the reverse side conductive layers 31, however, may be formed only either in the front side conductive layers 21 or in the reverse side conductive layers 31.

Fourth Embodiment

The fourth embodiment of the invention will be described below. The thermoelectric converter 1 of this embodiment is different in configuration of cavities formed in the insulating base 10 from the first embodiment. Other arrangements are identical, and explanation thereof in detail will be omitted here.

Figure 11:
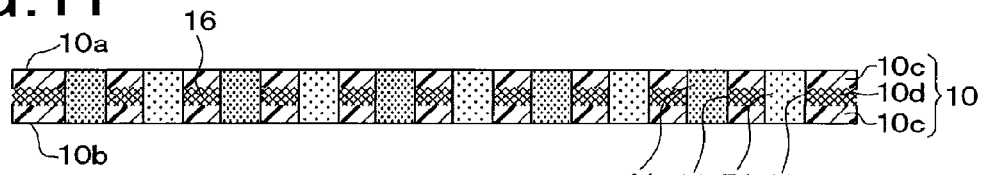
FIG. 11 a sectional view corresponding to FIG. 4(e) in the fourth embodiment of the invention.

In this embodiment, the insulating base 10 is, as illustrated in FIG. 11, made by stacking a thermoplastic resin film 10c, a glass cloth 10d having a plurality of cavities 16 formed therein, and a thermoplastic resin film 10c and pressing them at low temperature to join them temporarily. The glass cloth 10d functions as a porous member.

When the stack body 80 is made, the thermoplastic resin will flow (or be impregnated) into the cavities 16 in the glass cloth 10d in the step of FIG. 4(i). In other words, the cavities 16 work to facilitate or enhance the flow of the thermoplastic resin to absorb the pressure acting on the cavities 16. This causes the pressure applied to the first and second conductive pastes 41 and 51 to be increased. The same beneficial effects as those in the first embodiment are, therefore, obtained.

Instead of the glass cloth 10d, an aramid non-woven cloth may optionally be used as the porous member.

Fifth Embodiment

The fifth embodiment of the invention will be described below. The thermoelectric converter 1 of this embodiment is different in cavities from the first embodiment. Other arrangements are identical, and explanation thereof in detail will be omitted here.

Figure 12:
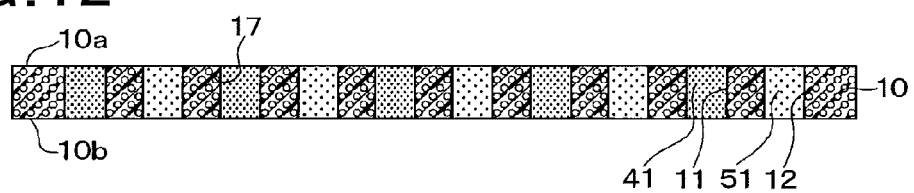
FIG. 12 a sectional view corresponding to FIG. 4(e) in the fifth embodiment of the invention.

The insulating base 10 is, as illustrated in FIG. 12, made of a porous member that is a thermoplastic resin film with a plurality of holes 17.

When the stack body 80 is made, the thermoplastic resin will flow (or be impregnated) into the plurality of holes 17 in the step of FIG. 4(i). In other words, the holes 17 work to absorb the pressure acting on the holes 17 with the flow of the thermoplastic resin, thus causing the pressure applied to the first and second conductive pastes 41 and 51 to be increased. The same beneficial effects as those in the first embodiment are, therefore, obtained.

Sixth Embodiment

The sixth embodiment of the invention will be described below. The thermoelectric converter 1 of this embodiment is different from the first embodiment in that the stack body 80 does not have the through holes 13. The stack body 80 is made by using press plates in which recesses are formed. Other arrangements are identical, and explanation thereof in detail will be omitted here.

Figure 13A:
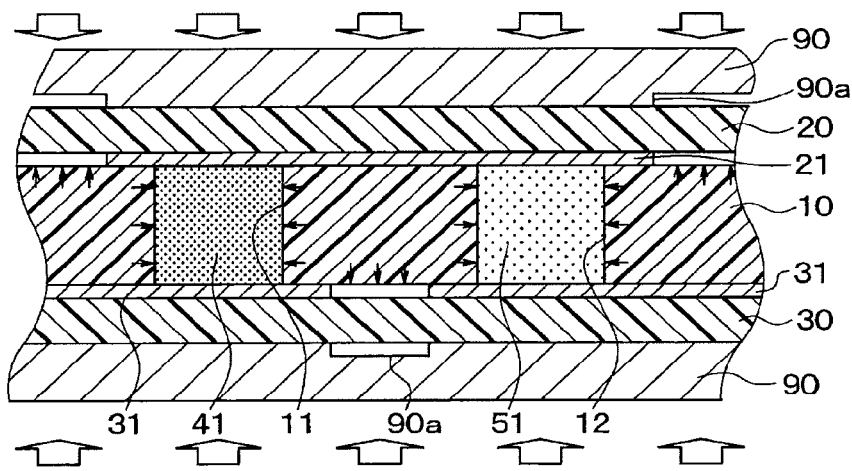
FIGS. 13(a) to 13(c) are sectional views when a step of FIG. 4(h) is performed in the sixth embodiment of the invention.

The stack body 80, as can be seen from FIG. 13(a), does not have the through holes 13 formed therein. Specifically, the stack body 80 is produced in the steps of FIGS. 4(a) to 4(d) and 4(f) to 4(h). The stack body 80 (i.e., an assembly of the insulating base 10, the front side protective member 20, the reverse side protective member 30) is pressed by two press plates 90 which have recesses 90a formed in portions thereof other than those facing the front side conductive layers 21 and the reverse side conductive layers 31.

Figure 13B:
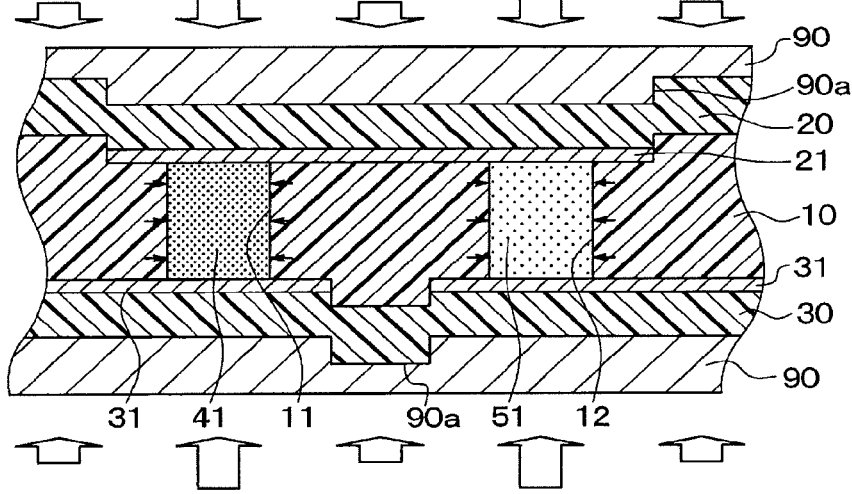
Figure 13C:
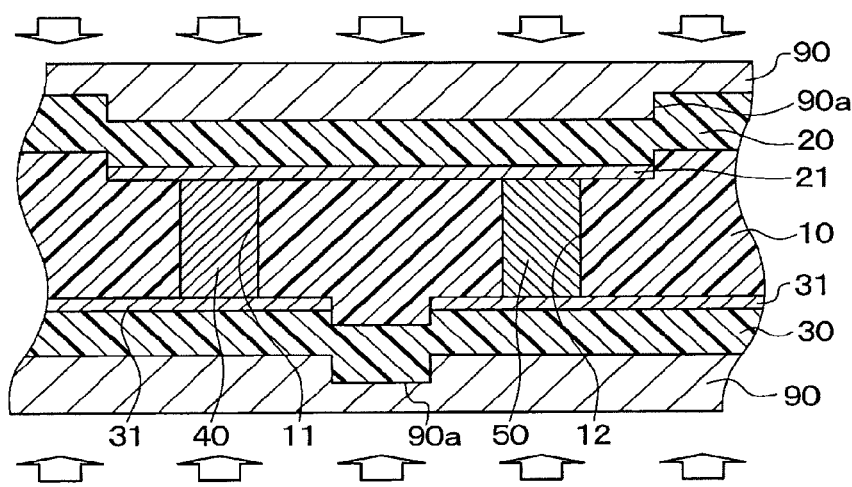

This causes, as can be seen from FIG. 13(b), the thermoplastic resin of which the front side protective members 20 and the reverse side protective member 30 are made to flow into the recesses 90a of the press plates 90. The flow of the thermoplastic resin into the recesses 90a also causes the thermoplastic resin of the insulating base 10 to move, thereby absorbing the lateral pressure acting on the first and second conductive pastes 41 and 51, which leads to an increase in pressure exerted by the press plates 90 on the first and second conductive pastes 41 and 51. The first and second conductive pastes 41 and 51 are, as illustrated in FIG. 13(c), solid-state sintered to make the first and second layer-to-layer connecting members 40 and 50. The thermoplastic resin of either one of the front side protective member 20 and the reverse side protective member 30 may be permitted to flow into the recesses 90a.

Specifically, the stack body 80 is assembled by using the press plates 90 in which the recesses 90a are formed, thereby permitting the thermoplastic resin making the insulating base 10 to flow. This causes the pressure applied to the first and second conductive pastes 41 and 51 to be elevated, thereby offering the same beneficial effects as those in the first embodiment.

The thermoelectric converter 1, as produced in this embodiment, will have protrusions formed by the thermoplastic resin flowing into the recesses 90a. The protrusions may be cut away after the stack body 80 is united. Alternatively, thermally conductive sheets may be placed over the protrusions to flatten the upper and lower surfaces of the thermoelectric converter 1.

The two press plates 90 have the recesses 90a formed therein, however, either one of the press plates 90 may optionally be equipped the recesses 90a.

This embodiment uses the press plates 90 which have the recesses 90a formed in portions thereof other than those facing the front side conductive layers 21 and the reverse side conductive layers 31, however, the press plates 90 may alternatively be designed to have the recesses 90a formed only in portions thereof which face the front side conductive layers 21 and the reverse side conductive layers 31. This also permits the thermoplastic resin of which the insulating base 10, the front side protective member 20, and the reverse side protective member 30 to move, thus producing the same beneficial effects as those in the first embodiment.

Seventh Embodiment

The seventh embodiment of the invention will be described below. This embodiment is different from the first embodiment in production process in which the insulating base 10 filled with the first and second conductive pastes 41 and 51 is prepared. Other arrangements are identical, and explanation thereof in detail will be omitted here.

In the production process of the thermoelectric converter 1, as illustrated in FIG. 14(a), the first and second via holes 11 and 12 are simultaneously formed in the insulating base 10.

Next, as illustrated in FIG. 14(b), a mask 91 is placed on the front surface 10a of the insulating base 10. The mask 91 has openings formed in areas thereof coinciding with the first via holes 11. Only the via holes 11 are filled with the first conductive paste 41.

Subsequently, as illustrated in FIG. 143(c), the mask 91 is removed. The second conductive paste 51 is, like in the first embodiment, put at room temperature. The insulating base 10 filled with the first and second conductive pastes 41 and 51 is, thus, prepared. Afterward, the same steps as in the first embodiment are performed to manufacture the thermoelectric converter 1 illustrated in FIG. 1.

As described above, this embodiment forms the first and second via holes 11 and 12 simultaneously in the insulating base 10. In other words, the first and second via holes are formed in a single process.

After the first via holes 11 are filled with the first conductive paste 41, the mask which has openings formed in areas thereof coinciding with the second via holes 12 may be placed on the front surface 10a of the insulating base 10. In this case, when the second conductive paste 51 is put into the second via holes 12, the mask works to avoid the entry of the second conductive paste 51 into the first via holes 11. This permits the second conductive paste 51 to be made of an organic solvent which will melt the first conductive paste 41 when the second conductive paste 51 is put into the second via holes 12. For instance, paraffin may be used, like the organic solvent of the first conductive paste 41.

Eighth Embodiment

The eighth embodiment of the invention will be described below. This embodiment is different from the first embodiment in structure of the insulating base 10 and shape of the first and second via holes 11 and 12 (i.e., the first and second layer-to-layer connecting members 40 and 50). Other arrangements are identical, and explanation thereof in detail will be omitted here.

As shown in FIG. 15, the insulating base 10 is made by stacking a thermosetting resin film 10e, a thermoplastic resin film 10c, and a thermosetting resin film 10e in sequence. The first and second via holes 11 and 12 (i.e., the first and second layer-to-layer connecting members 40 and 50) are each shaped to have diameters near the front surface 10a and, the reverse surface 10b of the insulating base 10 which are greater than that of a central portion thereof.

The thermoelectric converter 1 is produced in the following way. The thermosetting resin film 10e, the thermoplastic resin film 10c, and the thermosetting resin film 10e are stacked. This assembly is pressed at low temperature and joined temporarily to make the insulating base 10.

Subsequently, in the steps of FIGS. 4(a) and 4(c), a plurality of large holes are formed in the thermosetting resin film 10e which defines the front surface 10a of the insulating base 10 and the thermosetting resin film 10e which defines the reverse surface 10b of the insulating base 10. The large-diameter holes are shaped to reach the surfaces of the thermoplastic resin film 10c. Afterward, in the thermoplastic resin film 10c, small-diameter holes which are smaller in diameter than the large-diameter holes of the thermosetting resin films 10e are made within the large-diameter holes to form the first and second via holes 11 and 12.

Figure 16A:
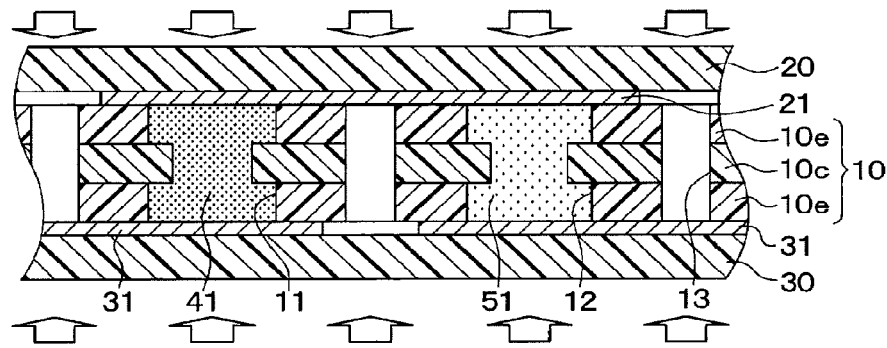
FIGS. 16(a) to 16(c) are sectional views corresponding to FIG. 4(i) showing a production step of a thermoplastic converter of FIG. 15.
Figure 16B:
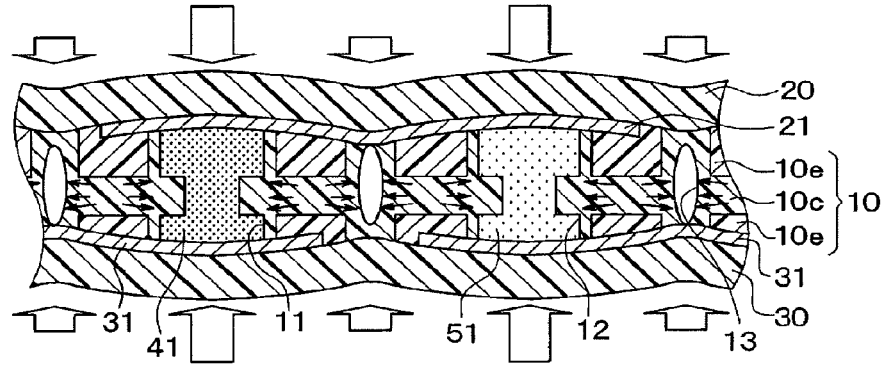
Figure 16C:
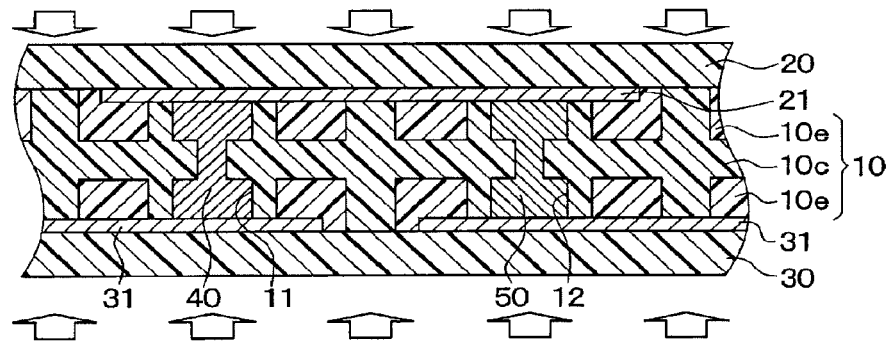

Subsequently, the step of FIG. 4(i) is performed to make the stack body 80. Specifically, when the stack body 80 is, as illustrated in FIG. 16(a), pressed at upper and lower surfaces thereof in the stacking direction, the thermoplastic resin (i.e., the thermoplastic resin film 10c), as can be seen in FIG. 16(b), flows to press the first and second conductive pastes 41 and 51 and also enters the through holes 13, while the thermosetting resin (i.e., the thermosetting resin films 10e) does not move. This causes, as illustrated in FIG. 16(c), the thermoplastic resin to flow into the through holes 13 and gaps between the thermosetting resin films 10e and the first and second layer-to-layer connecting members 40 and 50.

Specifically, the thermoplastic resin flows into the through holes 13, so that the through holes 13 deform, thereby absorbing force acting on the first and second conductive pastes 41 and 51 in the radial direction (i.e., the lateral pressure in the drawing). This results in an increase in pressure applied to the first and second conductive pastes. This production method also offers the same beneficial effects as in the first embodiment.

The thermosetting resin does not flow, thus avoiding the displacement of the first and second via holes 11 and 12 in the planar direction of the stack body 80 which arises from the flow of the thermoplastic resin. The thermosetting resin films 10e, thus, creates a resistance to the flow of the thermoplastic resin, thereby avoiding the flow of the thermoplastic resin, especially, out of the outer edge of the insulating base 10.

In this embodiment, the first and second via holes 11 and 12 are each shaped to have diameters near the front surface 10a and the reverse surface 10b of the insulating base 10 which are greater than that of the central portion thereof, thereby ensuring a sufficient area of contact between the first and second layer-to-layer connecting members 40 and 50 and the front side conductive layers 21 and between the first and second layer-to-layer connecting members 40 and 50 and the reverse side conductive layers 31 to avoid the possibility of electric disconnection. The thermal conductivity of the first and second layer-to-layer connecting members 40 and 50 is also reduced as compared with when the diameters of the first and second via holes 11 and 12 near the front surface 10a and the reverse surface 10b of the insulating base 10 are constant.

The insulating base 10 of this embodiment is designed as a stack body made up of three resin films: the thermosetting resin film 10e, the thermoplastic resin film 10c, and the thermosetting resin film 10e, however, may alternatively be formed by a stack of two or four or more resin films.

Ninth Embodiment

The ninth embodiment of the invention will be described below. The thermoelectric converter 1 of this embodiment is different from that of the first embodiment in that it does not have the front side protective member 30 and the reverse side protective member 30. Other arrangements are identical, and explanation thereof in detail will be omitted here.

Only the front side conductive layers 21 are placed on the front surface 10a of the insulating base 10, while only the reverse side conductive layers 31 are placed on the reverse surface 10b of the insulating base 10.

Figure 18:
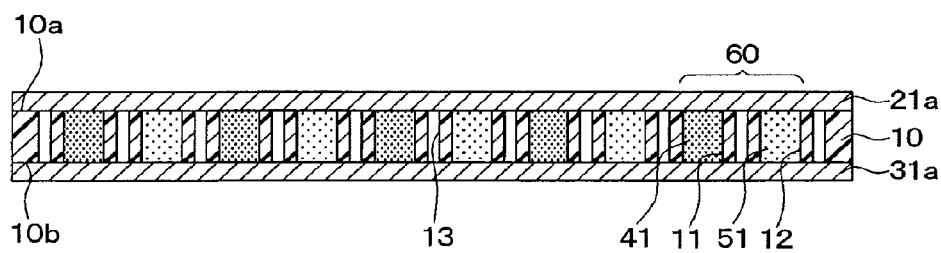
FIG. 18 is a sectional view corresponding to FIG. 4(h) which shows a production step of the thermoelectric converter of FIG. 17.

The thermoelectric converter 1 is produced in the following way. A front side metallic plate 21a and a reverse side metallic plate 31a are, as illustrated in FIG. 18, placed on the front surface 10a and the reverse surface 10b of the insulating base 10, respectively, to make the stack body 80. The front side metallic plate 21a and the reverse side metallic plate 31a are made of copper plates and identical in size with the planar shape of the insulating base 10.

Figure 17:
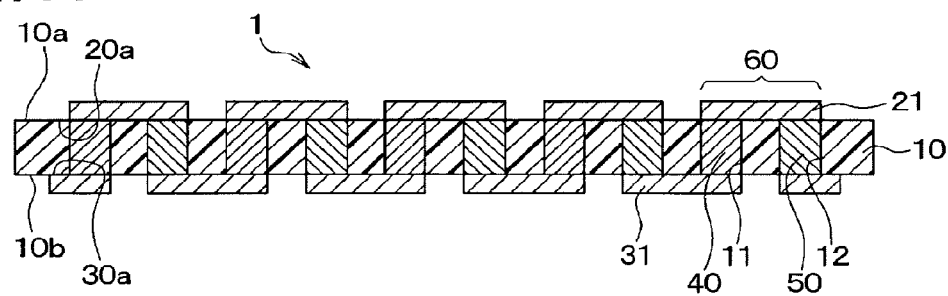
FIG. 17 is a sectional view of a thermoelectric converter in the ninth embodiment of the invention.

After the stack body 80 is made in the step of FIG. 4(i), the front side metallic plate 21a is subjected to die cutting to connect only the first and second layer-to-layer connecting members 40 and 50 of each of the pairs 60 with the same one of the front side conductive layers 21. The reverse side metallic plate 31a is also subjected to die cutting to connect only the first layer-to-layer connecting member 40 of one of adjacent two of the pairs 60 and the second layer-to-layer connecting member 50 of the other pair 60 with the same one of the reverse side conductive layers 31. This completes the thermoelectric converter 1 illustrated in FIG. 17.

The thermoelectric converter 1 which has only the front side conductive layers 21 and the reverse side conductive layers 31 placed on the front surface 10a of the insulating base 10 and the reverse surface 10b of the insulating base 10 may be produced by any of the production methods, as described above.

Tenth Embodiment

The tenth embodiment of the invention will be described below. The thermoelectric converter 1 of this embodiment is different in the second layer-to-layer connecting members 50 from that of the first embodiment. Other arrangements are identical, and explanation thereof in detail will be omitted here.

Figure 19:
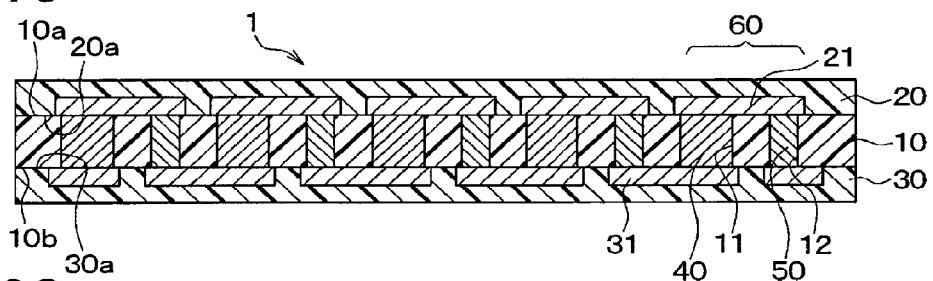
FIG. 19 is a sectional view of a thermoelectric converter in the tenth embodiment of the invention.

The second layer-to-layer connecting members 50 are, as illustrated in FIG. 19, formed by sintering the second conductive paste 51 containing particles of metal such as Ag—Sn, etc. Specifically, the second layer-to-layer connecting members 50 do not mainly work to produce the thermoelectric effect, but are designed to establish the electric conduction. For this purpose, the second via holes 12 are smaller in diameter than the first via holes 11. In other words, a sectional area of the second via holes 12, as taken parallel to the front surface of the insulating base 10, is smaller than that of the first via holes 11, as taken parallel to the front surface of the insulating base 10.

The thermoelectric converter 1 also have the first layer-to-layer connecting members 40, the front side conductive layers 21, and the reverse side conductive layers 31 which are made of metallic materials different from each other, thus producing the thermoelectric effect between the first layer-to-layer connecting members 40 and the front side conductive layers 21 and between the first layer-to-layer connecting members 40 and the reverse side conductive layers 31.

Although not illustrated, the second via holes 12 which are smaller in diameter than the first via holes 11 are formed in the step of FIG. 4(c). The thermoelectric converter 1 is produced with the second conductive paste 51 made of a conductive paste containing particles of metal such as Ag—Sn, etc.

The thermoelectric converter 1 designed to have the second layer-to-layer connecting members 50 mainly working to establish the electric conduction may be produced by any of the production methods, as described above.

The second layer-to-layer connecting members 50 is not solid-state sintered to establish connections with the front side conductive layers 21 and the reverse side conductive layers 31, but are coupled with them through metallic bonds.

Eleventh Embodiment

Figure 20:
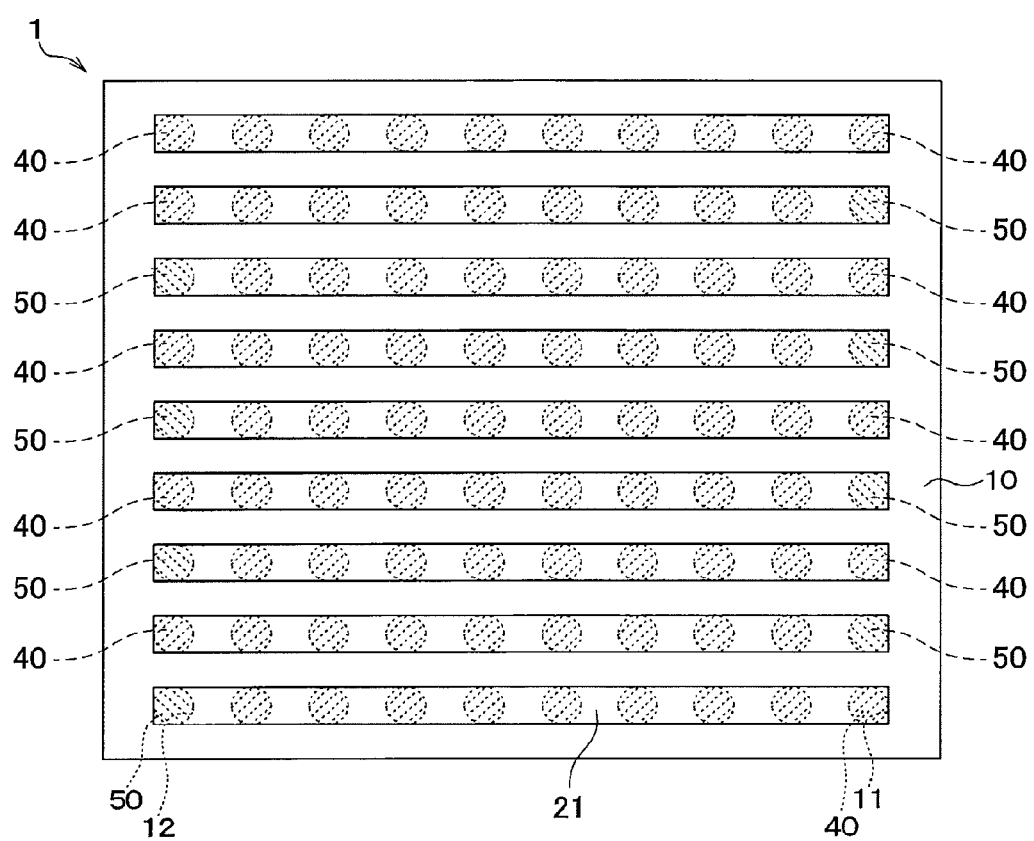
FIG. 20 is a plane view on a front side of a thermoelectric converter in the eleventh embodiment of the invention.
Figure 21:
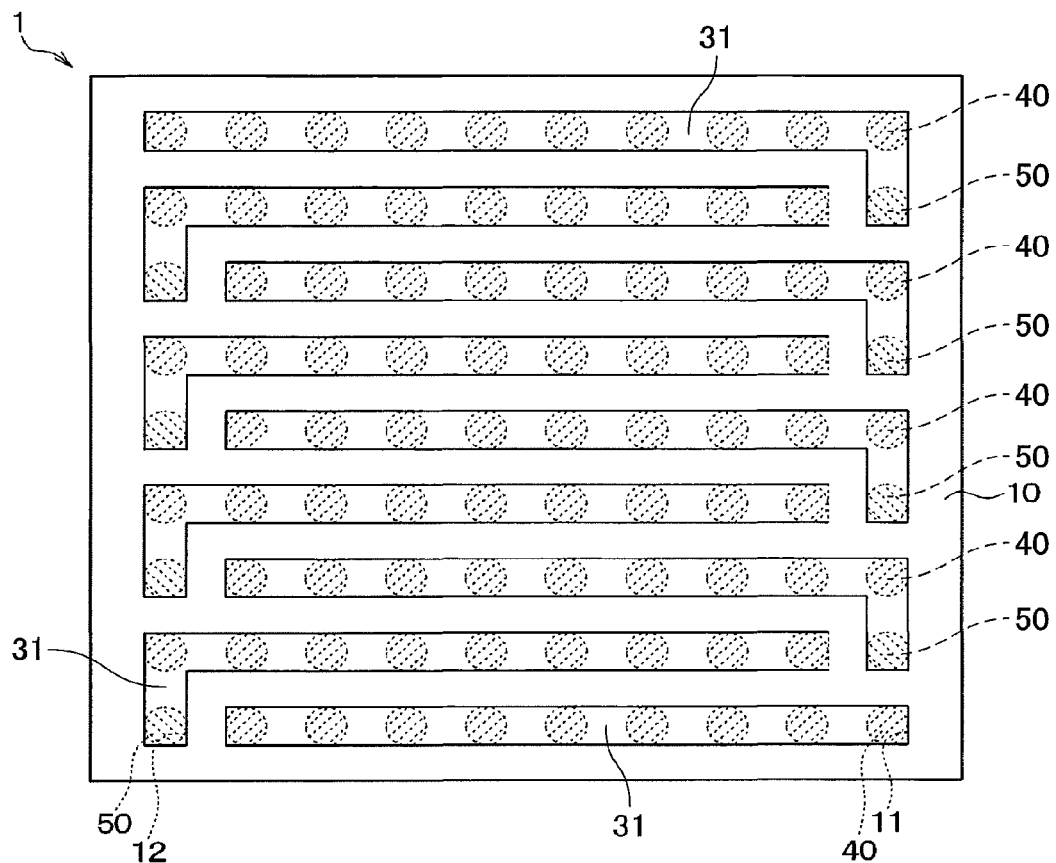
FIG. 21 is a plane view on a reverse side of the thermoelectric converter of FIG. 20.

The thermoelectric converter 1 of the eleventh embodiment will be described below using FIGS. 20 and 21. The thermoelectric converter 1 is different in arrangement of the first and second via holes 11 and 12 from that of the tenth embodiment. Other arrangements are identical, and explanation thereof in detail will be omitted here. FIG. 20 illustrates the front surface of the insulating base 10 on which the front side conductive layers 21 are disposed. FIG. 21 illustrates the reverse surface of the insulating base 10 on which the reverse side conductive layers 31 are disposed. In FIGS. 20 and 21, the first layer-to-layer connecting members 40 and the second layer-to-layer connecting members 50 are shown by hatched lines different in orientation from each other.

The first via holes 11 and the second via holes 12 are, as can be seen from FIGS. 20 and 21, arranged in a plurality of horizontal arrays extending in the lengthwise direction of the insulating base 10 (i.e., the horizontal direction in FIGS. 20 and 21). The second via hole 12 lies only at the end of each of the horizontal arrays. More specifically, in each of right and left ones of vertical arrays extending in the width-wise direction of the insulating base 10 (i.e., the vertical direction in FIGS. 20 and 21), the first and second via holes 11 and 12 are arranged alternately.

Figure 23:
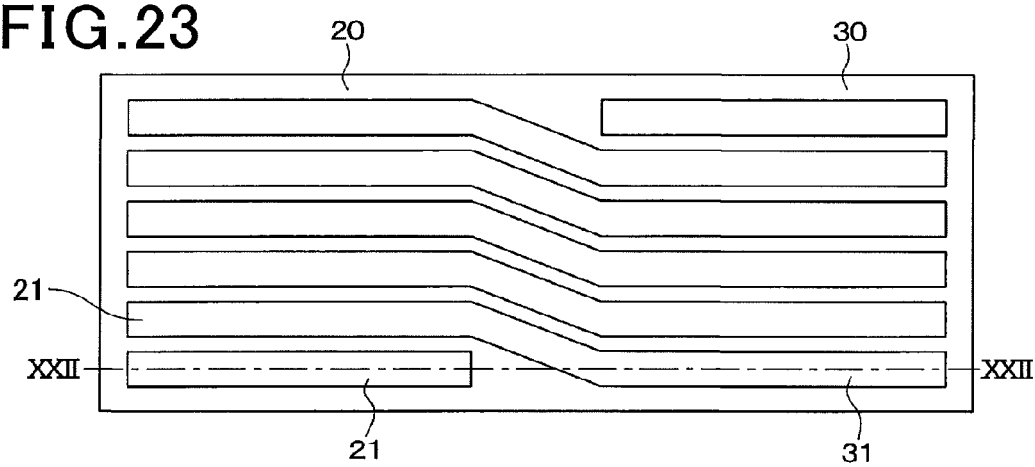
FIG. 23 is a development view of a front side protective member and a reverse side protective member.

The first and second layer-to-layer connecting members 40 in each of the horizontal arrays are joined to the same one of the front side conductive layers 21. The first layer-to-layer connecting members 40 in each of the horizontal arrays are, as can be seen in FIG. 23, coupled with the same one of the reverse side conductive layers 31. Each of the reverse side conductive layers 31 is, as clearly illustrated in FIG. 21, of an L-shape. Each of the second layer-to-layer connecting members 50 is connected to one of the reverse side conductive layers 31 to which the first layer-to-layer connecting members 40 in an adjacent one of the horizontal arrays are joined.

Specifically, in this embodiment, the first layer-to-layer connecting members 40 in each of the horizontal arrays are connected in parallel to each other. The parallel-connected first layer-to-layer connecting members 40 are joined to the first layer-to-layer connecting members 40 in an adjacent one of the horizontal arrays through one of the second layer-to-layer connecting members 50.

For the sake of ease of understanding, FIG. 20 omits the front side protective member 20. FIG. 20 is not a sectional view, but hatches, as described above, the first layer-to-layer connecting members 40 and the second layer-to-layer connecting members 50. Similarly, for the sake of ease of understanding, FIG. 21 omits the reverse side protective member 30. FIG. 21 is not a sectional view, but hatches, as described above, the first layer-to-layer connecting members 40 and the second layer-to-layer connecting members 50.

Figure 22:
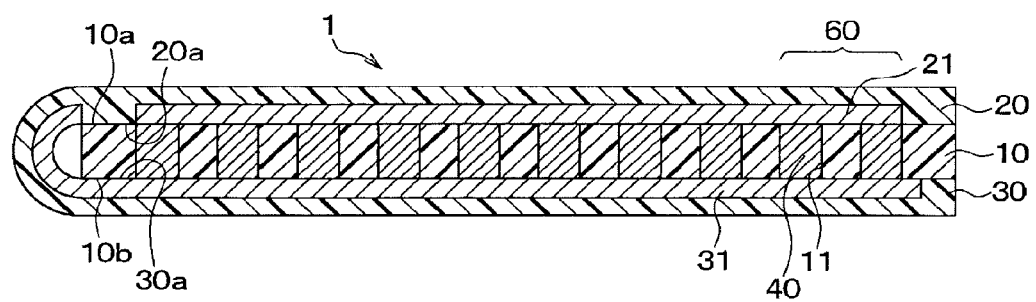
FIG. 22 is a sectional view of a thermoelectric converter in the twelfth embodiment of the invention.

Although not illustrated, the production of the thermoelectric converter 1 is achieved by changing locations where the first and second via holes 11 and 12 are formed in the steps of FIGS. 4(a) and 4(c) and forming the front side conductive layers 21 and the reverse side conductive layers 31 to have the configurations illustrated in FIGS. 21 and 22 in the steps of FIGS. 4(f) and 4(g).

The thermoelectric converter 1 in which the first and second via holes 11 and 12 are not formed alternately may, as apparent from the above discussion, be made by any of the production methods in the above described embodiments.

Twelfth Embodiment

The twelfth embodiment of the invention will be described below. The thermoelectric converter 1 of this embodiment is different from the first embodiment in that it includes only the first via holes 11, and the front side protective member 20 and the reverse side protective member 30 are formed integrally with each other. Other arrangements are identical, and explanation thereof in detail will be omitted here. FIG. 23 is a development diagram of FIG. 22.

The insulating base 10, as illustrated in FIGS. 22 and 23, has only the first via holes 11 formed therein. In other words, the insulating base 10 has only the first layer-to-layer connecting members 40 disposed therein. The front side protective member 20 and the reverse side protective member 30 are united. In other words, the front side protective member 20, as can be seen from FIG. 23, continues to the reverse side protective member 30.

Each of the front side conductive layers 21 is, as clearly illustrated in FIG. 23, connected to the first layer-to-layer connecting members 40 of each of the horizontal arrays. Each of the reverse side conductive layers 31 leading to the front side conductive layers 21 is coupled with the first layer-to-layer connecting members 40 in one of the horizontal arrays which is located adjacent the horizontal array of the first layer-to-layer connecting members 40 to which the above reverse side conductive layer 31 is joined.

In other words, the first layer-to-layer connecting members 40 arrayed along the longer side of the insulating base 10 in each of the horizontal arrays are connected in parallel to each other.

Although not illustrated, the thermoelectric converter 1 is made by forming only the first via holes 11 in the insulating base 10 in the step of FIG. 4(a) and integrally forming the front side protective member 20 and the reverse side protective member 30 in the steps of FIG. 4(f) and FIG. 4(g).

The thermoelectric converter 1 of this embodiment may be completed by any of the production methods in the above described embodiments.

Thirteenth Embodiment

The thirteenth embodiment of the invention will be described below. This embodiment relates to an electronic device 100 equipped with the thermoelectric converter 1 of the first embodiment. The thermoelectric converter 1 is identical in structure with that of the first embodiment, and explanation thereof in detail will be omitted here. The thermoelectric converter 1 works to heat or cool the electronic device 100 and keep it at a desired temperature or utilize the heat, as produced by the electronic device 100 to generate electric power.

Figure 24:
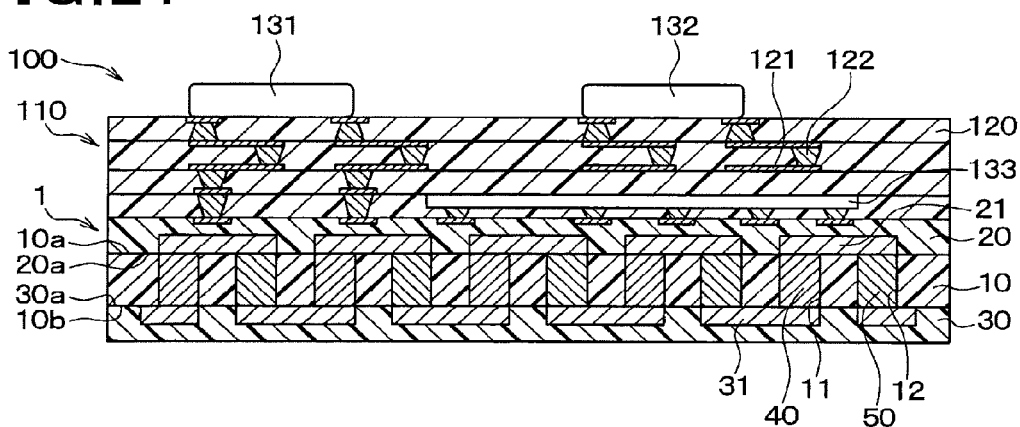
FIG. 24 is a sectional view of an electronic device in the thirteenth embodiment of the invention.
Figure 25:
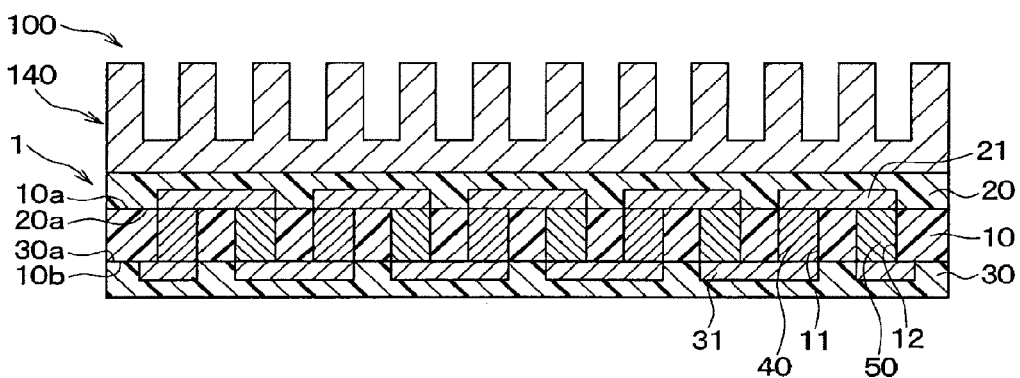
FIG. 25 is a sectional view an electronic device equipped with a thermoelectric converter.

The electronic device 100 is, as illustrated in FIG. 24, equipped with a multi-layer board 110 placed on the front side protective member 20 of the thermoelectric converter 1. The multi-layer board 110 includes a stack made up of a plurality of (four in this embodiment) resin films 120 equipped with a wiring pattern 121 and layer-to-layer connecting members 122, and semiconductor chips 131 to 133 mounted inside the stack and on the surface of the stack which is farther away from the thermoelectric converter 1. The thermoelectric converter 1 and the multi-layer board 110 are joined directly together.

The thermoelectric converter 1 installed in the electronic device 100 functions to cool the multi-layer board 110 or produce electric power supplied to the chips 131 to 133. The thermoelectric converter 1 may optionally be used to supply electric power to the multi-layer board 110. This is achieved by providing layer-to-layer connecting members, like in the above embodiments, in the thermoelectric converter 1 and the multi-layer board 110 to connect the thermoelectric converter 1 and the multi-layer board 110 together.

The electronic device 100 is produced by laying the reverse side protective member 30, the insulating base 10, the front side protective member 20, and the plurality of resin films 120 to overlap each other to make the stack body 80 and pressing and uniting the stack body 80 while being heated. In other words, the thermoelectric converter 1 is joined to the multi-layer board 110 while the thermoelectric converter 1 is being produced.

As described above, when the thermoelectric converter 1 in this embodiment is fabricated, it is simultaneously joined to the multi-layer board 110. This results in a simplified production process of the electronic device 100 as compared with when the thermoelectric converter 1 is made and then joined to the multi-layer board 110 using adhesive material.

The electronic device 100 is made by directly joining the thermoelectric converter 1 and the multi-layer board 110 together. In other words, an unwanted inclusion is not interposed between the thermoelectric converter 1 and the multilayer board 110. This facilitates the transmission of heat from the multi-layer board 110 to the thermoelectric converter 1, thereby achieving a high degree of transfer of heat between the multi-layer board 110 and the thermoelectric converter 1 in the electronic device 100.

The multi-layer board 110 of the electronic device 100 has the stack made up of the plurality of resin films 120, however, may be fabricated by a stack of a plurality of ceramic plates. After only the multi-layer board 110 is made, the reverse side protective member 30, the insulating base 10, the front side protective member 20, and the multi-layer board 110 are placed to overlap each other to make the stack body 80.

Other Embodiments

The invention is not limited to the above described embodiments, but includes all possible combinations of the above embodiments and modifications thereof within the scope of the appended claims.

For instance, the above described embodiments may be combined in the following way. The first and second embodiments may be combined with the third embodiment to form the through holes 13 or the grooves 14 along with the recesses 15. The second embodiment may be combined with the seventh to twelfth embodiments to form the grooves 14 instead of the through holes 13. The third embodiment may be combined with the seventh to twelfth embodiments to form the recesses 15 instead of the through holes 13. The fourth embodiment may be combined with the seventh to twelfth embodiments to use the glass cloth 10d instead of the through holes 13. The fifth embodiment may be combined with the seventh to twelfth embodiments to use the thermoplastic resin films 10c in which the plurality of holes 17 are formed instead of the through holes 13.

In the case where the glass cloth 10d or the thermoplastic resin film 10c is used, all or any one of the through holes 13, the grooves 14, and the recesses 15 may be made.

The sixth embodiment may be combined with the first to fifth embodiments to unite the stack body 80 using the two press plates 90 in which the recesses 90a are formed.

The eighth embodiment may be combined with the ninth to twelfth embodiments to use a stack of the thermoplastic resin film 10c and the thermosetting rein films 10e as the insulating base 10. In the case where the insulating base 10 made of the stack of the thermoplastic resin film 10c and the thermosetting rein films 10e is, like in the eighth embodiment, used, the first and second via holes 11 and 12 may be designed to have a constant diameter. The ninth embodiment may be combined with the tenth to twelfth embodiments to make the front side conductive layers 21 and the reverse side conductive layers 31 using the metallic plates 21a and 31a.

The thermoelectric converter 1, as described above, may be engineered to have a combination of some of the structures in the above described embodiments and also produced by any of the production methods in the embodiments.

The third embodiment uses the thermoelectric converter 1 and the multi-layer board 110 to make the electronic device 100, however, an object to which the thermoelectric converter is secured is not limited to the multi-laver board 110.

For instance, the electronic device 100 may be equipped with fins 140 mounted on the front side protective member 20 of the thermoelectric converter 1. The electronic device 100 is, thus, capable of improving the dissipation of heat through the fins 140. The electronic device 100 is produced by making the stack body 80 equipped with the fins 140 and pressing the stack body 80 while being heated.

Figure 26:
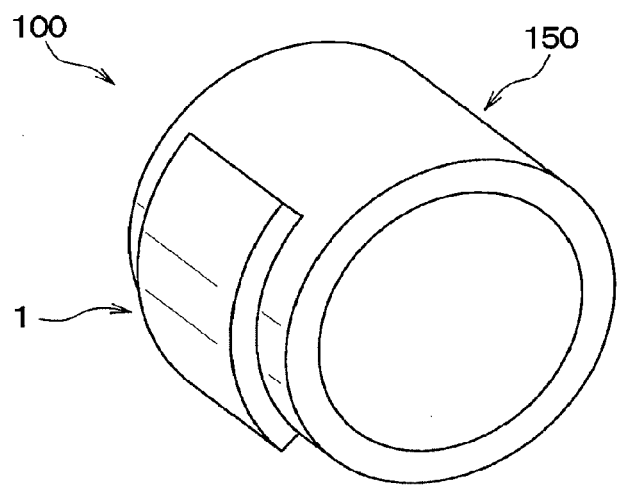
FIG. 26 is a sectional view of a modification of an electronic device equipped with a thermoelectric converter.

For instance, the electronic device 100 may be, as illustrated in FIG. 26, designed to have the thermoelectric converter 1 attached to a pipe 150 whose cross section is circular.

The thermoelectric converter 1 used with the above electronic device 100 is produced by using two press plates with curved surfaces in heating the stack body 80 in the unifying step of FIG. 4(i). In the unifying step, the flow of the resin of which the insulating base 10 is made, as described above, results in application of pressure to the first and second via holes 11 and 12 to press the metallic particles against each other and also against the front side conductive layers 21 and the reverse side conductive layers 31, thereby ensuring the stability of the joint in the curved shape. Such a type of electronic device 100 may be made by joining the thermoelectric converter 1 to an object in the course of production of the thermoelectric converter 1.

The insulating base 10, the front side protective member 20, and the reverse side protective member 30 are made of resin, so that the thermoelectric converter 1 is flexible, thus permitting the thermoelectric converter 1 to be curved along the shape of the object after the thermoelectric converter 1 has been completed.

Figure 27:
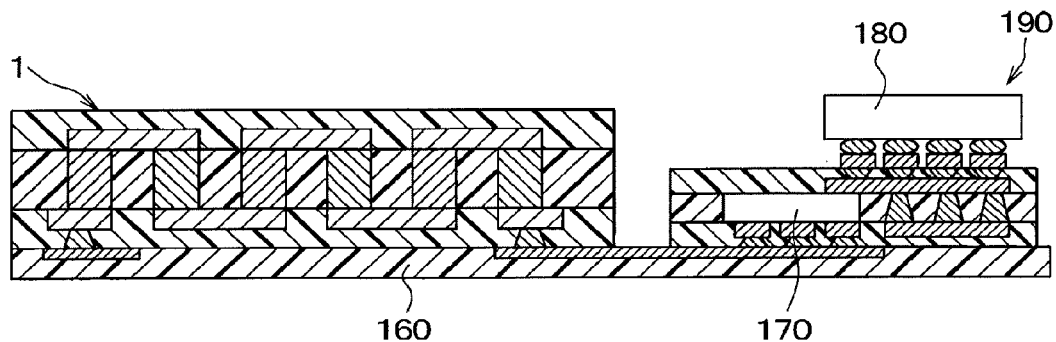
FIG. 27 is a sectional view of another modification of an electronic device equipped with a thermoelectric converter.

The electronic device 100 may be, as illustrated in FIG. 27, made of the thermoelectric converter 1 and an electronic device 190. The thermoelectric converter 1 is mounted on a base 160. The electronic device 190 is equipped with a communication system 180. The communication system 180 includes a control IC chip 170 mounted over the base 160. The thermoelectric converter 1 works to generate and deliver electric power to the communication system 180. FIG. 27 illustrates the communication system 180 as being exposed, however, the communication system 180 may be installed inside the thermoelectric converter 1 (i.e., the insulating base 10).

The thermoelectric converter 1 or the electronic device 100 equipped with the thermoelectric converter 1 may be mounted on a roof or a wall which separates between indoors and outdoors for use in generating electric power with a difference in temperature between the indoors and the outdoors or alternatively be utilized as generating electric power with a difference in temperature between the air and ground.

EXPLANATION OF SYMBOLS 10 insulating base
10a front surface
10b reverse surface
11 first via hole
12 second via hole
20 front side protective member
21 front side conductive layer
30 reverse side protective member
31 reverse side conductive layer
40 first layer-to-layer connecting member
41 first conductive paste
50 second layer-to-layer connecting member
51 second conductive paste
60 pair
80 stack body

The invention claimed is:
1. A thermoelectric converter comprising:
a front side protective member equipped with a plurality of front side conductive layers;
a reverse side protective member equipped with a plurality of reverse side conductive layers;
an insulating base which has a plurality of first and second via holes which extend through a thickness thereof, said insulating base containing thermoplastic and having a front surface and a reverse surface;
first layer-to-layer connecting members which are disposed in said first via holes and made of alloy in which a plurality of atoms keep a given crystal structure constant; and
second layer-to-layer connecting members which are disposed in said second via holes and made of metal different in kind from said alloy, characterized in that wherein
when the first layer-to-layer connecting member disposed in each of the first via holes and the second layer-to-layer connecting member disposed in an adjacent one of the second via holes is defined as a pair, said front side protective member is placed on the front surface of said insulating base with the first layer-to-layer connecting member and the second layer-to-layer connecting member of each pair being in direct contact with a same and corresponding one of the front side conductive layers, and said reverse side protective member is placed on the reverse surface of said insulating base with the first layer-to-layer connecting member in one of two adjacent pairs and the second layer-to-layer connecting member in the other one of the two adjacent pairs being in direct contact with a same and corresponding one of the reverse side conductive layers, and
the insulating base surrounds peripheries of each first layer-to-layer connecting member and each second layer-to-layer connecting member.

2. The thermoelectric converter according to claim 1, wherein the insulating base includes through holes.

3. The thermoelectric converter according to claim 1, wherein the insulating base has through holes disposed at regular intervals away from each other in a circumferential direction of a circle concentric with each of the first and second via holes.

4. The thermoelectric converter according to claim 1, wherein the insulating base has closed loop grooves so that one of either of the first via holes are the second via holes lies within each of the loop grooves.

5. The thermoelectric converter according to claim 1, wherein at least one of the front side conductive layer and the reverse side conductive layers has a recess in a portion thereof other than a portion which is in contact with the first layer-to-layer connecting member or the second layer to-layer connecting member.

6. The thermoelectric converter according to claim 1, wherein the insulating base includes a porous member having a cavity disposed therein.

7. The thermoelectric converter according to claim 1, wherein the insulating base is porous and has a hole formed therein.

8. The thermoelectric converter according to claim 1, wherein the insulating base includes a stack of a thermosetting resin film, a thermoplastic resin file, and a thermosetting resin film.

9. The thermoelectric converter according to claim 1, wherein a sectional area of the second via holes, as taken parallel to the front surface of the insulating base, is smaller than that of the first via holes, as taken parallel to the front surface of the insulating base.

* * * * *